United States Patent
Kawasaki

(10) Patent No.: US 8,013,625 B2
(45) Date of Patent: Sep. 6, 2011

(54) SEMICONDUCTOR DEVICE

(75) Inventor: Kenichi Kawasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 216 days.

(21) Appl. No.: 12/191,609

(22) Filed: Aug. 14, 2008

(65) Prior Publication Data

US 2009/0045833 A1    Feb. 19, 2009

(30) Foreign Application Priority Data

Aug. 15, 2007   (JP) .................................. 2007-211842

(51) Int. Cl.
*G01R 31/26*    (2006.01)
(52) U.S. Cl. ................................. 324/762.01
(58) Field of Classification Search .................. None
See application file for complete search history.

(56) References Cited

U.S. PATENT DOCUMENTS

| 4,542,485 | A | * | 9/1985 | Iwahashi et al. | ......... 365/189.09 |
| 7,050,920 | B2 | * | 5/2006 | Abe | .............................. 702/118 |
| 7,383,138 | B2 | * | 6/2008 | Ito et al. | ........................... 702/60 |
| 7,571,413 | B1 | * | 8/2009 | Ghosh Dastidar et al. | ..... 716/16 |

FOREIGN PATENT DOCUMENTS

| JP | 03-036748 A | 2/1991 |
| JP | 08-201474 A | 8/1996 |

* cited by examiner

*Primary Examiner* — Vinh P Nguyen
(74) *Attorney, Agent, or Firm* — Arent Fox LLP

(57) ABSTRACT

A first power-cutoff switch is disposed between a power line and an internal power line dedicated for a circuit block, and has a current supply capacity having the level at which ON-current can protect an external examination environment. A second power-cutoff switch is disposed between a power line and an internal power line, and has a current supply capacity having the level at which ON-current can supply consumed current of the circuit block. A detecting circuit detects that a voltage of the internal power line matches a reference voltage. The first power-cutoff switch is ON/OFF by an operation state of the circuit block. The second power-cutoff switch is ON by detecting the matching of the volumes with the detecting circuit and is OFF by the ON/OFF operation of the first power-cutoff switch.

11 Claims, 28 Drawing Sheets

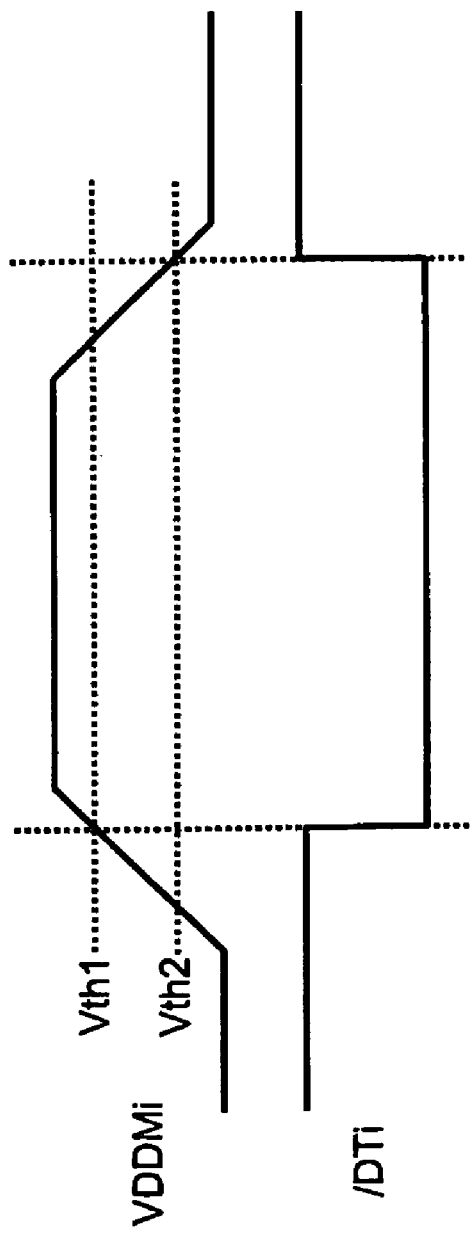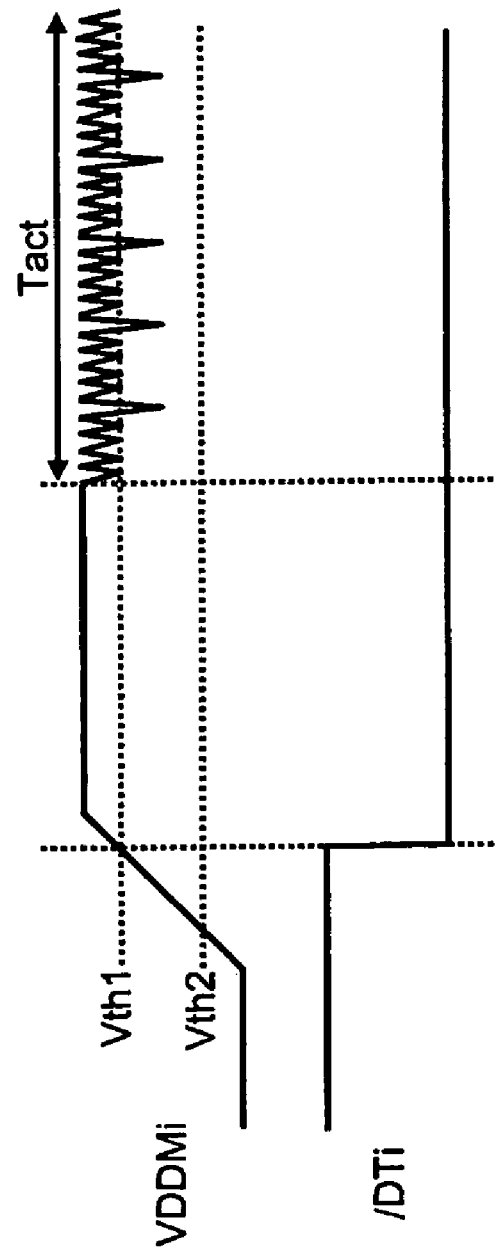

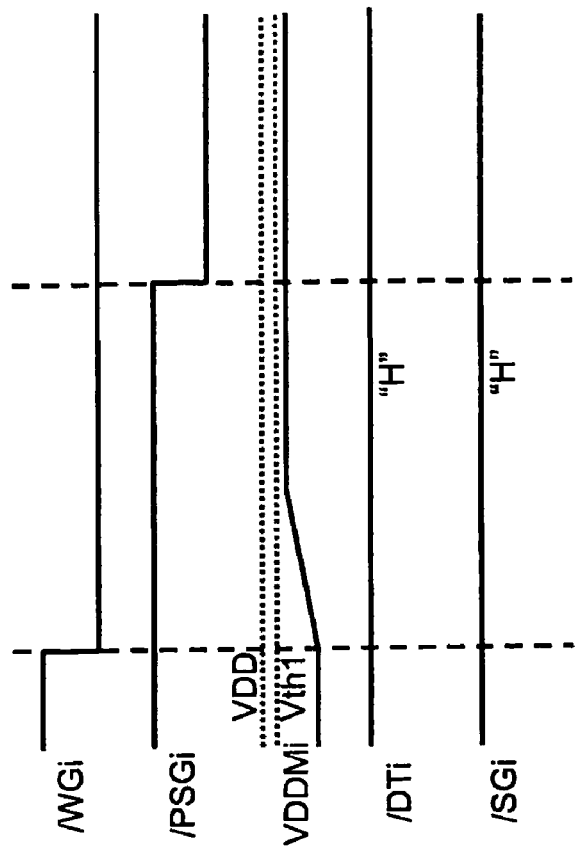
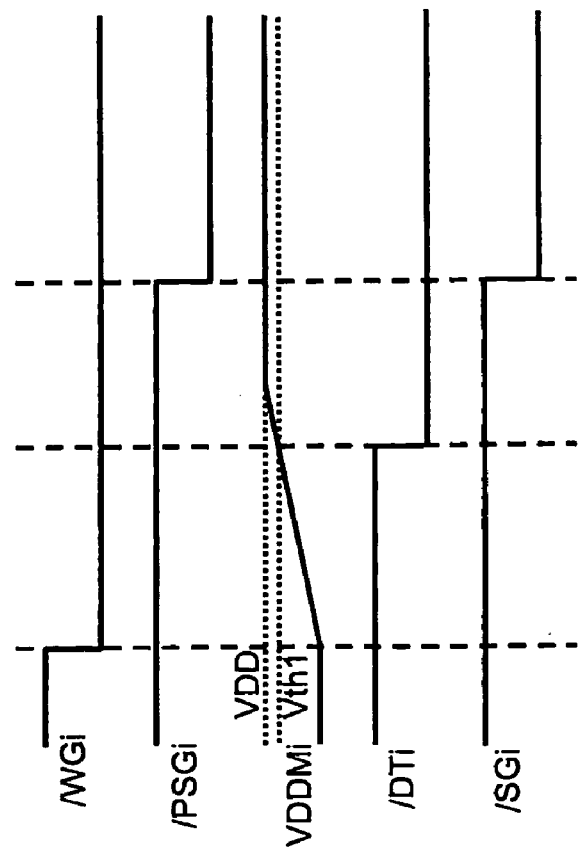
Fig. 3B
Fig. 3A

| Pvdd1 (VDD1) | Pvdd2 (VDD2) | Pvdd3 (VDD3) | Pvss (VSS) | PORTION TO BE MEASURED |
|---|---|---|---|---|
| A MINUTE VOLTAGE | 0V | 0V | 0V | (A) |
| 0V | A MINUTE VOLTAGE | 0V | 0V | (B) (C) |
| 0V | 0V | A MINUTE VOLTAGE | 0V | (C) (D) |

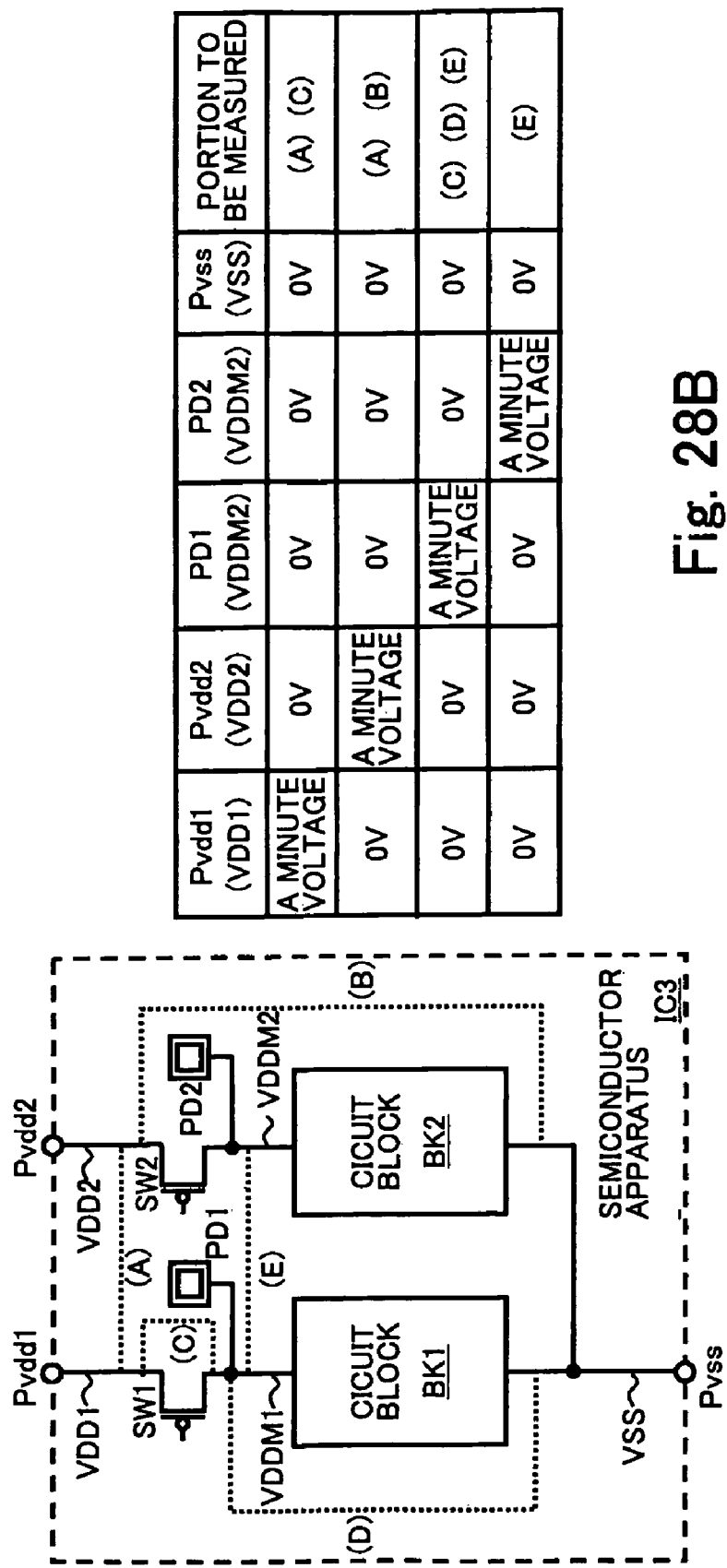

SEMICONDUCTOR DEVICE

BACKGROUND OF THE INVENTION

1. Field of the Invention

The present invention relates to a semiconductor device having a power cutoff function.

2. Description of the Related Art

A power short-circuit examination for detecting a power short-circuit defect, as one of defective modes of a semiconductor device (Large Scale Integration: LSI) is generally embodied in the examination processing of the semiconductor device.

FIGS. 26A and 26B show the power short-circuit examination of the semiconductor device. In the power short-circuit examination of a semiconductor device IC1 shown in FIG. 26A, voltages applied to power terminals Pvdd1, Pvdd2, and Pvdd3, and a ground terminal Pvss are set as shown in FIG. 26B and current thereof is measured. Further, the result of measurement is compared with a predetermined value, thereby selecting the semiconductor device IC1. More specifically, in a state for applying 0V to the power terminals Pvdd2 and Pvdd3 and the ground terminal Pvss, a minute voltage by which a circuit block BK1 does not operate is applied to the power terminal Pvdd1 and current thereof is measured. When the result of measurement is over the predetermined value, a power short-circuit (A) between a power line VDD1 and a ground line VSS and a power short-circuit (B) between the power line VDD1 and a power line VDD2 are detected. Then, the semiconductor device IC1 is selected as a defective product having the power short-circuit as a power short defect. In a state in which a voltage 0V is applied to the power terminals Pvdd1 and Pvdd3 and the ground terminal Pvss, a minute voltage by which a circuit block BK2 does not operate is applied to the power terminal Pvdd2 and current thereof is measured. When the result of measurement is over a predetermined value, a power short-circuit (B) between the power line VDD1 and the power line VDD2 and a power short-circuit (C) between the power line VDD2 and a power line VDD3 are detected, and the semiconductor device IC1 is selected as a defective product having a power short-circuit. In a state in which a voltage 0V is applied to the power terminals Pvdd1 and Pvdd2 and the ground terminal Pvss, a minute voltage by which a circuit block BK3 does not operate is applied to the power terminal Pvdd3 and current thereof is measured. When the result of measurement is over a predetermined value, the power short-circuit (C) between the power line VDD2 and the power line VDD3 and a power short-circuit (D) between the power line VDD3 and the ground line VSS are detected, and the semiconductor device IC1 is selected as a defective product having a power short-circuit.

The power short-circuit examination is an important examination not only to select the defective product having the power short-circuit but also to protect an external examination environment of an examination device. Although a power short-circuit of 10 mΩ exists between the power line and the ground line within the semiconductor device, if a rated voltage of 1.5V is applied to the power terminal of the semiconductor device, extremely large current of 150A flows and the external examination environment can be thus destroyed. Therefore, the power short-circuit examination is usually embodied in the initial stage of the examination processing.

Recently, for portable electrical apparatuses, such as a mobile phone and a digital camera, low-power consumption of the semiconductor device mounted on the electrical apparatus is strongly requested, and a semiconductor device having a power-cutoff function is increasingly used. For the purpose of reduction in power consumption of the semiconductor device, the power cutoff function cuts-off the supply of a power-supply voltage depending on the use for every circuit block in the semiconductor device. Although the installation of the power cutoff function to the semiconductor device is effective for reducing the power consumption, this causes a problem in the power short-circuit examination.

FIGS. 27A and 27B shows a problem upon installing the power cutoff function to the semiconductor device. A description will be given of the problem upon installing the power cutoff function to the semiconductor device with a semiconductor device IC2 shown in FIG. 27A as an example. The semiconductor device IC2 comprises circuit blocks BK1 and BK2 and power cutoff switches SW1 and SW2 for embodying the power cutoff function. The power cutoff switch (pMOS transistor) SW1 is connected between a power line VDD1 and a power line VDDM1 dedicated for the circuit block BK1, is turned on when the circuit block BK1 is used, and is turned off when the circuit block BK1 is not used. The power cutoff switch (pMOS transistor) SW2 is connected between a power line VDD2 and a power line VDDM2 dedicated for the circuit block BK2, is turned on when the circuit block BK2 is used, and is turned off when the circuit block BK2 is not used. With the semiconductor device IC2 having the above structure, in a state in which the power cutoff switches SW1 and SW2 are turned off, the power short-circuit examination can be embodied. Therefore, the power short-circuit examination cannot detect a part of the power short-circuits. Referring to FIG. 27B, a minute voltage is applied to a power terminal Pvdd1 and current thereof is measured in a state in which a voltage 0V is applied to a power terminal Pvdd2 and a ground terminal Pvss. The result of measurement is compared with a predetermined value, thereby detecting a power short-circuit (A) between a power line VDD1 and a power line VDD2. However, when the power cutoff switches SW1 and SW2 are turned off, it is not possible to detect a power short-circuit (C) between the power line VDD1 and the power line VDDM1, a power short-circuit (D) between the power line VDDM1 and the ground lines VSS, and a power short-circuit (E) between the power line VDDM1 and the power line VDDM2. Further, in a state in which a voltage 0V is applied to the power terminal Pvdd1 and the ground terminal Pvss, a minute voltage is applied to the power terminal Pvdd2 and current thereof is measured. The result of measurement is compared with a predetermined value, thereby detecting the power short-circuit (A) between the power line VDD1 and the power line VDD2 and the power short-circuit (B) between the power line VDD2 and the ground line VSS. However, when the power cutoff switches SW1 and SW2 are turned off, it is not possible to detect the power short-circuit (E) between the power line VDDM1 and the power line VDDM2. As mentioned above, in the semiconductor device IC2 having the above structure, the power short-circuits (C), (D), and (E) cannot be detected by the power short-circuit examination. Although the power short-circuit (D) exists in the semiconductor device IC2, if it is determined that the semiconductor device IC2 is a non-defective product, the power cutoff switch SW1 is turned on when a rated voltage is applied to the power terminal Pvdd1 in an examination different form the power short-circuit examination, thereby destroying the external examination environment.

As a conventional art for solving the problem, such a method is known that a pad for examination connected to a power line dedicated for a circuit block is provided, a minute voltage is applied to the pad for examination in addition to a power terminal in the power short-circuit examination and current thereof is measured.

FIGS. 28A and 28B show a power short-circuit examination of a semiconductor device having a power cutoff function. A semiconductor device IC3 shown in FIG. 28A is structured by adding pads PD1 and PD2 for examination to the semiconductor device IC2 shown in FIG. 27A. In a power short-circuit examination of the semiconductor device IC3 having the power cutoff function, voltages applied to the power terminals Pvdd1 and Pvdd2, the pad PD1 and PD2 for an examination, and the ground terminal Pvss are set as shown in FIG. 28B and current thereof is measured. The result of measurement is compared with a predetermined value, thereby selecting the semiconductor device IC3. More specifically, in a state for applying a voltage 0V to the power terminal Pvdd2, the pads PD1 and PD2 for examination, and the ground terminal Pvss, a minute voltage is applied to the power terminal Pvdd1 and current thereof is measured. When the result of measurement is over the predetermined value, the power short-circuits (A) and (C) are detected, and the semiconductor device IC3 is selected as a defective product having the power short-circuit. Further, in a state for applying a voltage 0V to the power terminal Pvdd1, the pads PD1 and PD2 for examination, and the ground terminal Pvss, a minute voltage is applied to the power terminal Pvdd2 and current thereof is measured. When the result of measurement is over a predetermined value, the power short-circuits (A) and (B) are detected and the semiconductor device IC3 is selected as a defective product having the power short-circuit. Furthermore, in a state for applying a voltage 0V to the power terminals Pvdd1 and Pvdd2, the pad PD2 for examination, and the ground terminal Pvss, a minute voltage is applied to the pad PD1 for examination and current thereof is measured. When the result of measurement is over a predetermined value, the power short-circuits (C), (D), and (E) are detected and the semiconductor device IC3 is selected as a defective product having the power short-circuit. In addition, in a state for applying a voltage 0V to the power terminals Pvdd1 and Pvdd2, the pad PD1 for examination, and the ground terminal Pvss, a minute voltage is applied to the pad PD2 for examination and current thereof is measured. When the result of measurement is over a predetermined value, the power short-circuit (E) is detected and the semiconductor device IC3 is selected as a defective product having the power short-circuit. The pads PD1 and PD2 for examination connected to the power lines VDDM1 and VDDM2 are arranged as mentioned above, thereby detecting all the power short-circuits (A) to (E) even if the power cutoff switches SW1 and SW2 are turned off in the power short-circuit examination.

In Japanese Laid-open Patent Publication No. 3-36748 and Japanese Laid-open Patent Publication No. 8-201474, disclosed is a technology that the pad for examination is disposed in the semiconductor device, a voltage is applied to the pad for examination, and current thereof is measured, or current is applied and a voltage thereof is measured so as to specify a defective portion in the semiconductor device.

If the power cutoff function is not controlled finely depending on the circuit blocks in the semiconductor device having the power cutoff function, the advantage for reducing the power consumption is small, and the number of internal power lines dedicated for circuit block exceeds 10 in some cases. Therefore, it is necessary to provide a large number of pads for examination in the semiconductor device according to the conventional art. Since the size of the pad for examination is prescribed by the specification of the examination device, even if the manufacturing technology of the semiconductor device advances and the circuit integration improves, the size of the pad for examination is not small. Therefore, the chip size of the semiconductor device cannot be small, and the manufacturing cost of the semiconductor device increases.

SUMMARY

According to an aspect of the invention, a semiconductor device has a circuit block, a first switch disposed between a first power line and a second power line for supplying a power-supply voltage to the circuit block, a second switch disposed between the first power line and the second power line, and a detecting circuit that detects the voltage difference between a voltage of the second power line and a reference voltage. The first switch is ON/OFF depending on an operation state of the circuit block. The second switch is ON depending on the voltage difference detected by the detecting circuit, and is OFF by OFF operation of the first switch.

BRIEF DESCRIPTION OF THE DRAWINGS

FIGS. 2A and 2B are explanatory diagrams showing an operation example of a level detecting circuit according to the first embodiment;

FIGS. 3A and 3B are explanatory diagrams showing an operation example (No. 1) of a semiconductor device according to the first embodiment;

FIGS. 28A and 28B are explanatory diagrams showing a power short-circuit examination of a semiconductor device having the power cutoff function.

DESCRIPTION OF THE PREFERRED EMBODIMENTS

Hereinbelow, embodiments according to the present invention will be described with reference to the drawings.

Figure 1:
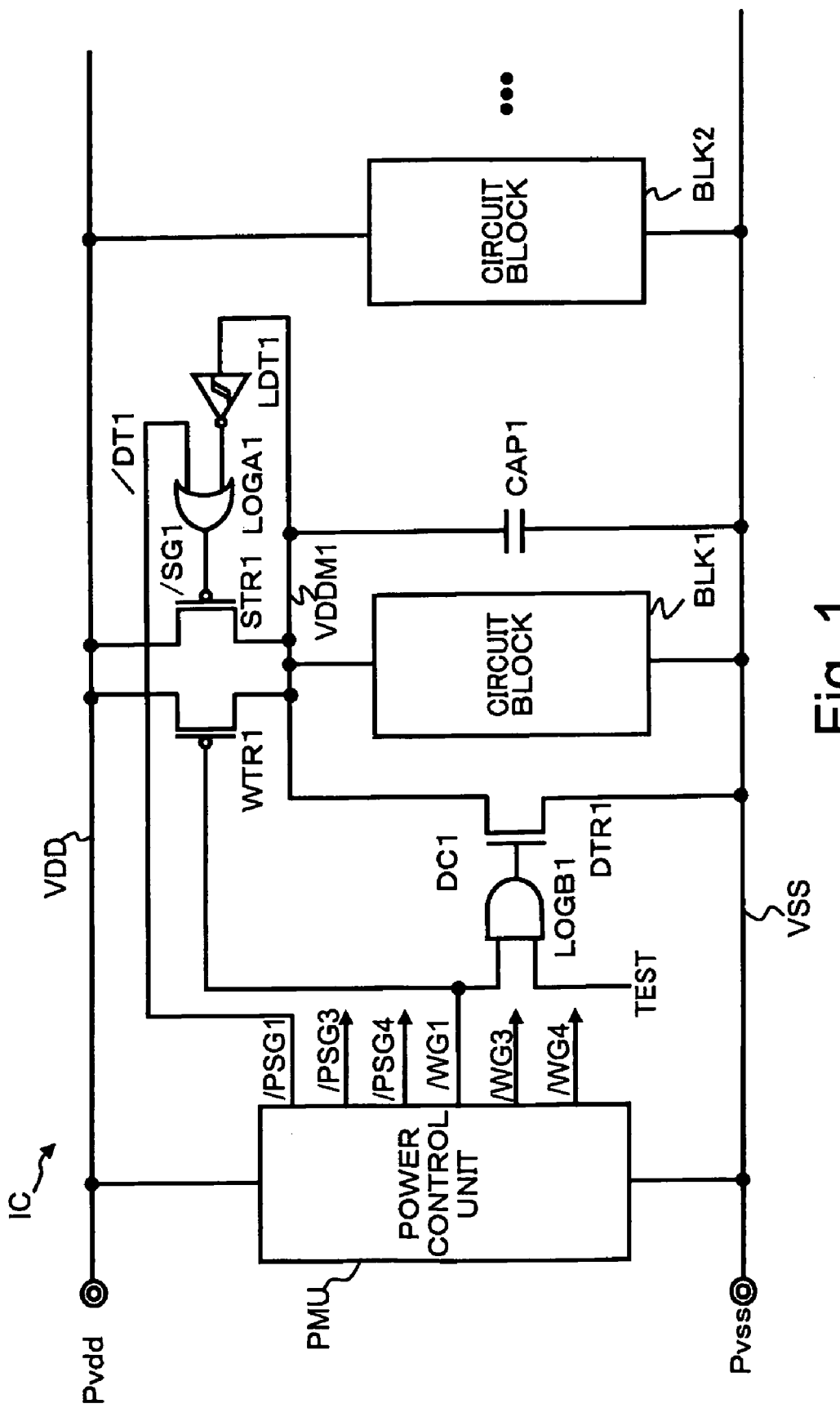
FIG. 1 is an explanatory diagram showing the first embodiment of the present invention.

FIG. 1 shows the first embodiment of the present invention. A semiconductor device IC according to the first embodiment comprises circuit blocks BLK1 to BLK5 that embody a processor function, a timer function, a communication function, and an external interface function. In the semiconductor device IC, the power cutoff functions are provided for the circuit blocks BLK1, BLK3, and BLK4, and the power cutoff functions of circuit block BLK1, BLK3, and BLK4 are controlled by a power control unit PMU. The power control unit PMU sets a control signal /WGi at the low level (voltage of a ground line VSS) at the operation start of a circuit block BLKi (i=1, 3, and 4), and sets a control signal /PSGi at the low level, after the elapse of a predetermined time after setting the control signal /WGi at the low level. Further, the power control unit PMU sets the control signals WGi and /PSGi at the high level (voltage of the power line VDD) at the operation end of the circuit block BLK. The power line VDD is connected to a power terminal Pvdd via a protecting circuit (not shown) comprising a resistor and an inductor. The ground line VSS is connected to the ground terminal Pvss via a protecting circuit (not shown) comprising a resistor and an inductor. Incidentally, portions relevant to the circuit blocks BLK1 and BLK2 in the semiconductor device IC are shown in FIG. 1.

The semiconductor device IC comprises: power cutoff switches WTRi and STRi; a level detecting circuit LDTi; logical circuits LOGAi and LOGBi; a stabilization capacitor CAPi; and a discharge switch DTRi, corresponding to the circuit block BLKi. The power cutoff switch WTRi is connected between the power line VDD and a power line VDDMi dedicated for the circuit block BLKi. The power cutoff switch WTRi comprises a pMOS transistor, is turned on upon setting the control signal /WGi at the low level, and is turned off upon setting the control signal /WGi at the high level. The power cutoff switch WTRi has a current supply capacity that ON-current has the level for protecting the external examination environment (examination device). Similarly to the power cutoff switch WTRi, the power cutoff switch STRi is connected between the power line VDD and the power line VDDMi. The power cutoff switch STRi comprises a pMOS transistor. The power cutoff switch STRi is turned on upon setting the control signal /SGi at the low level, and turned off upon setting the control signal /SGi at the high level. The power cutoff switch STRi has a current supply capacity that ON-current has the level for supplying the consumed current of the circuit block BLKi.

The level detecting circuit LDTi is disposed to detect that the voltage of the power line VDDMi matches a reference voltage or the voltage difference between the voltage of the power line VDDMi and the reference voltage is a prescribed one, and comprises a hysteresis inverter having threshold voltages Vth1 and Vth2 (Vth1>Vth2). Incidentally, the threshold voltage Vth1 of the hysteresis inverter corresponds to the reference voltage of the level detecting circuit LDTi. When the voltage of the power line VDDMi rises and matches the threshold voltage Vth1, the level detecting circuit LDTi shifts a detection result signal /DTi from the high level to the low level. When the voltage of the power line VDDMi drops and matches the threshold voltage Vth2, the level detecting circuit LDTi shifts the detection result signal /DTi from the low level to the high level. Alternatively, the level detecting circuit LDTi shifts the detection result signal /DTi from the high level to the low level, when the voltage of the power line VDDMi increases and the voltage difference between the increased voltage and the threshold voltage Vth1 is a predetermined one. When the voltage of the power line VDDMi decreases and the voltage difference between the decreased voltage and the threshold voltage Vth2 is a predetermined one, the level detecting circuit LDTi shifts the detection result signal /DTi from the low level to the high level. In another embodiment, which will be described later, the level detecting circuit is not limited to the structure for detecting the coincidence between the voltage of the power line (ground line) dedicated for the circuit block and the reference voltage, and the level detecting circuit may detect that the voltage difference between the voltage of the power line (ground line) dedicated for the circuit block and the reference voltage is a predetermined one. When the detection result signal /DTi is set at the low level, the logical circuit LOGAi sets the control signal /SGi at the same level as that of the control signal /PSGi. When the detection result signal /DTi is set at the high level, the logical circuit LOGAi sets the control signal /SGi at the high level.

The stabilization capacitor CAPi is connected between the power line VDDMi and the ground line VSS. When a test signal TEST supplied from a test control circuit (not shown) is set at the high level, the logical circuit LOGBi sets the control signal DCi at the same level as that of the control signal /WGi. When the test signal TEST is set at the low level, the logical circuit LOGBi sets the control signal DCi at the low level. The discharge switch DTRi is disposed to discharge the electric charges stored in the stabilization capacitor CAPi, and is connected between the power line VDDMi and the ground line VSS. The discharge switch DTRi comprises an nMOS transistor, is ON upon setting the control signal DCi at the high level, and is OFF upon setting the control signal DCi at the low level.

FIGS. 2A and 2B show an operation example of the level detecting circuit LDTi according to the first embodiment. In the level detecting circuit LDTi comprising a hysteresis inverter, as shown in FIG. 2A, if the voltage of the power line VDDMi rises and then matches the threshold voltage Vth1, the detection result signal /DTi shifts from the high level to the low level. If the voltage of the power line VDDMi drops and then matches the threshold voltage Vth2, the detection result signal /DTi shifts from the low level to the high level. Therefore, as shown in FIG. 2B, even if the voltage of the power line VDDMi changes by the operation of the circuit block BLKi for an operation period Tact of the circuit block BLKi, the voltage of the power line VDDMi does not match the threshold voltage Vth2. Therefore, the detection result signal /DTi does not shift from the low level to the high level. Thus, in the level detecting circuit LDTi comprising the hysteresis inverter, the reference voltage can be set to be high, and the margin to the noise of the power line VDDMi with the operation of the circuit block BLKi is increased.

FIGS. 3A and 3B show an operation example (No. 1) of the semiconductor device IC according to the first embodiment. Referring to FIG. 3A, an operation example including no power short-circuit in the semiconductor device IC is shown. If the control signal /WGi shifts from the high level to the low level, the power cutoff switch WTRi having a small current-supply capacity shifts from OFF to ON. After ending to charge the stabilization capacitor CAPi connected to the power line VDDMi, the voltage of the power line VDDMi rises to a voltage equivalent to the voltage of the power line VDD, exceeding the threshold voltage Vth1 of the level detecting circuit LDTi. If the voltage of the power line VDDMi matches the threshold voltage Vth1 of the level detecting circuit LDTi, the detection result signal /DTi shifts from the high level to the low level. If a predetermined time passes after the control signal /WGi shifts from the high level to the low level and the control signal /PSGi shifts from the high level to the low level, the control signal /SGi shifts from the high level to the low level because the detection result signal /DTi is then set at the low level. Thereby, the power cutoff switch STRi with a large power-capacity shifts from OFF to ON. Since ON-current of the power cutoff switch WTRi is converged to the level for supplying normal leakage current of the circuit block BLKi at the time, the power cutoff switch STRi shifts to ON in a safe mode.

FIG. 3B shows an operation example in which the power short-circuit exists between the power line VDDMi and the ground line VSS in the semiconductor device IC. If the control signal /WGi shifts from the high level to the low level, the power cutoff switch WTRi with a small current-capacity shifts from OFF to ON and the voltage of the power line VDDMi then starts to rise. However, since the power short-circuit exists between the power line VDDMi and the ground line VSS, the voltage of the power line VDDMi does not rise to the threshold voltage Vth1 of the level detecting circuit LDTi. Therefore, the detection result signal /DTi does not shift from the high level to the low level. Consequently, the control signal /WGi shifts from the high level to the low level and a predetermined time thereafter passes and, even if the control signal /PSGi shifts from the high level to the low level, the control signal /SGi does not shift from the high to the low level. The power cutoff switch STRi with a large current-capacity is not ON. Therefore, the external examination environment, such as the examination device, can be protected without fail. Further, since the ON-current of the power cutoff switch WGTi continues to flow, a defective product having the power short-circuit can be selected by measuring the current.

Figure 4:
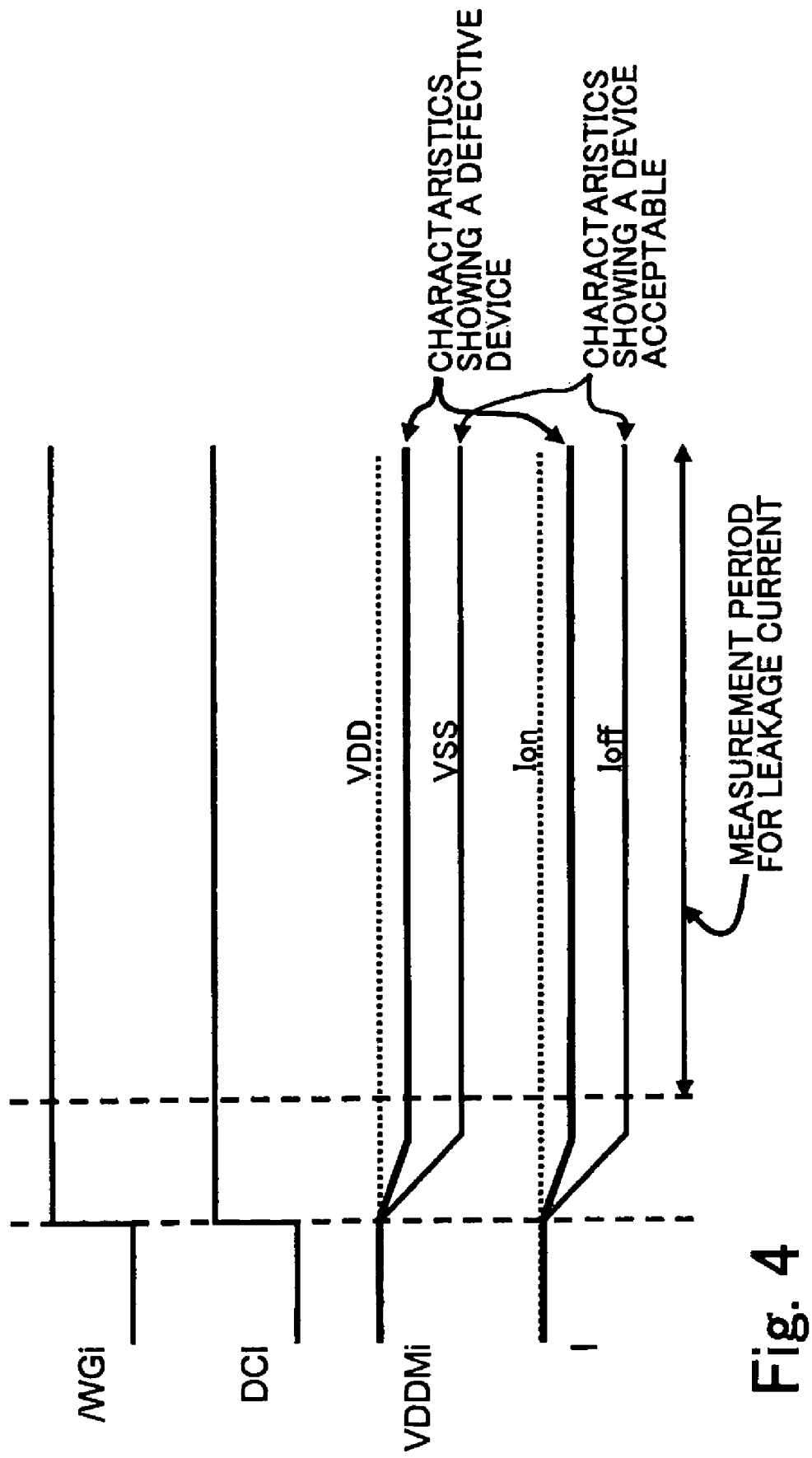
FIG. 4 is an explanatory diagram showing an operation example (No. 2) of the semiconductor device according to the first embodiment.

FIG. 4 shows an operation example (No. 2) of the semiconductor device IC according to the first embodiment. If the control signal /WGi shifts from the low level to the high level when the test signal TEST is set at the high level, the control signal DCi also shifts from the low level to the high level. Accordingly, the discharge switch DTRi shifts from OFF to ON and electric charges stored in the stabilization capacitor CAPi are discharged. When the power short-circuit does not exist in the semiconductor device IC (when the semiconductor device IC is a non-defective product), the voltage of the power line VDDMi drops from the voltage equivalent to the voltage of the power line VDD to the voltage equivalent to the voltage of the ground line VSS. Further, leakage current I decreases from leakage current Ion at the ON-time of the power cutoff switches WTRi and STRi, and when all the electric charges stored in the stabilization capacitor CAPi are discharged, it is converged on leakage current Ioff at the OFF-time of the power cutoff switches WTRi and STRi. On the other hand, when the power short-circuit exists between the power line VDD and the power line VDDMi in the semiconductor device IC (when the semiconductor device IC is a defective product), the voltage of the power line VDDMi does not drop to the voltage equivalent to the voltage of the ground line VSS. Further, the leakage current I does not decrease to the leakage current Ioff at the OFF-time of the power cutoff switches WTRi and STRi. Since ON-current of the discharge switch DTRi continues flowing, the defective product having the power short-circuit can be selected by measuring the current. Incidentally, when inspecting the existence of the power short-circuit between the power line VDD and the power line VDDM1, power cutoff switches WTR3, WTR4, STR3, and STR4 are turned on. Thereby, with same method, it is also possible to inspect the existence of the power short-circuit between the power line VDDM1 and a power line VDDM3 and the power short-circuit between the power line VDDM1 and a power line VDDM4.

According to the first embodiment, a defective product having the power short-circuit can be selected safely while avoiding the destruction of the external examination environment due to the defective product having the power short-circuit, without providing the pad for examination. Further, according to the first embodiment, the present invention is applied to the semiconductor device having power cutoff functions provided for three circuit blocks. Upon applying the present invention to a semiconductor device having power cutoff functions to ten circuit blocks, ten pads for examination are unnecessary. Therefore, the chip size of the semiconductor device can be reduced and the manufacturing cost of the semiconductor device can be greatly reduced.

Although the power cutoff switch comprising the pMOS transistor is disposed to the power line VDD side of the circuit block BLKi according to the first embodiment, the present invention is not limited to this embodiment. A power cutoff switch comprising an nMOS transistor may be disposed to the power line VDD side of the circuit block BLKi. Alternatively, a power cutoff switch comprising a pMOS transistor may be disposed to the ground line VSS side of the circuit block BLKi. Alternatively, a power cutoff switch comprising an nMOS transistor may be disposed to the ground line VSS side of the circuit block BLKi. Further, according to the first embodiment, the discharge switch comprising the nMOS transistor is disposed. However, the present invention is not limited to this embodiment, and a discharge switch comprising a pMOS transistor may be disposed.

Figure 5:
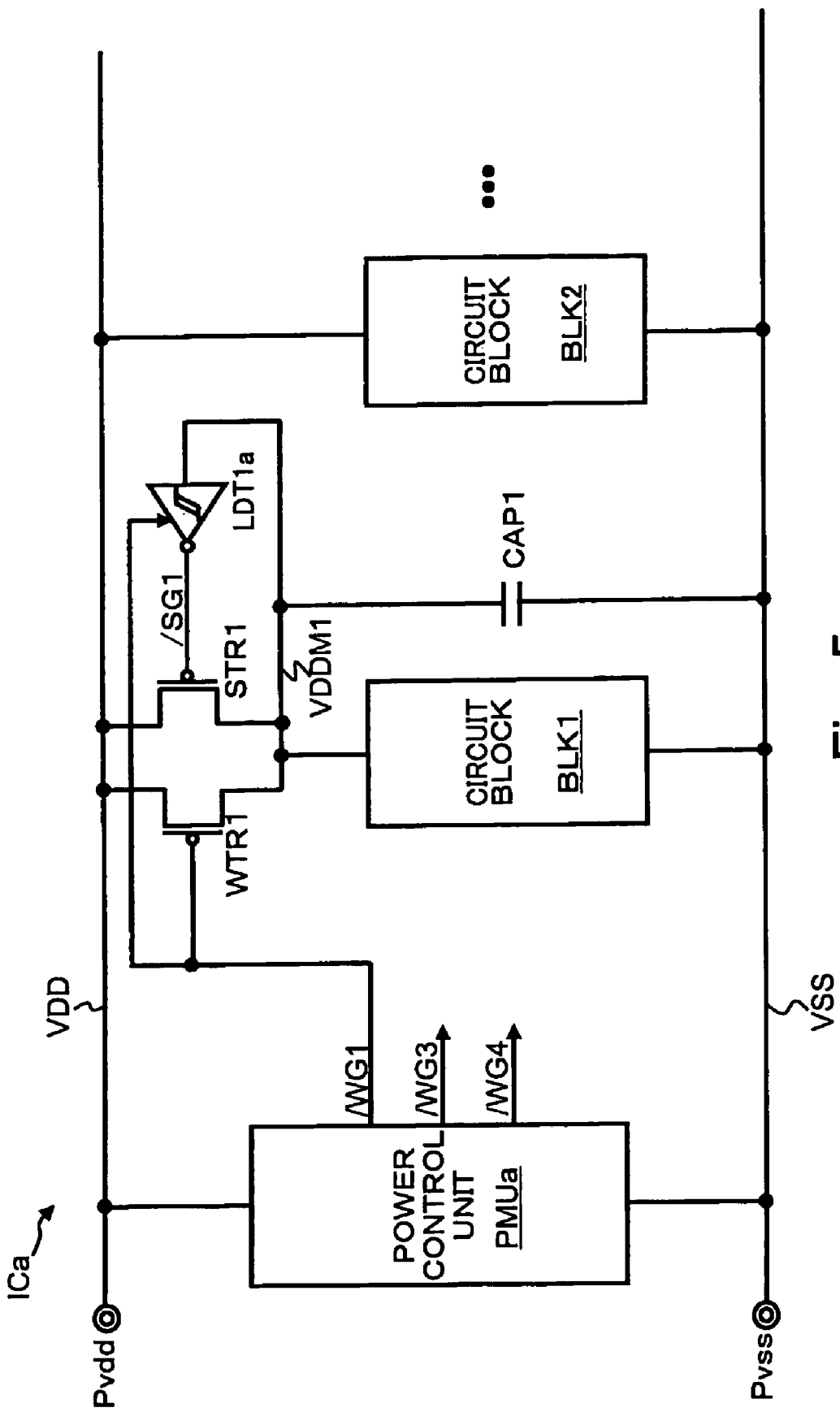
FIG. 5 is an explanatory diagram showing according to the second embodiment of the present invention.

FIG. 5 shows the second embodiment of the present invention. Incidentally, upon describing the second embodiment, the same numerals as those used according to the first embodiment denote the same components, and the detailed explanation is omitted. A semiconductor device ICa according to the second embodiment comprises circuit blocks BLK1 to BLK5, similarly to the semiconductor device IC according to the first embodiment. Power cutoff functions are provided for circuit blocks BLK1, BLK3, and BLK4 in the semiconductor device ICa, and power cutoff functions of the circuit block BLK1, BLK3, and BLK4 are controlled by a power control unit PMUa. The power control unit PMUa sets the control signal /WGi at the low level at the operation start of the circuit block BLKi (i=1, 3, 4), and further sets the control signal /WGi at the high level at the operation end of the circuit block BLKi. Incidentally, portions relevant to the circuit blocks BLK1 and BLK2 in the semiconductor device ICa are shown in FIG. 5.

The semiconductor device ICa comprises a stabilization capacitor CAPi, power cutoff switches WTRi and STRi, and a level detecting circuit LDTia, corresponding to the circuit block BLKi. When the control signal /WGi is set at the low level, the level detecting circuit LDTia sets the control signal /SGi to the low level when the voltage of the power line VDDMi is higher than the reference voltage, and the level detecting circuit LDTia sets the control signal /SGi to the high level when the voltage of the power line VDDMi is lower than the reference voltage. When the control signal /WGi is set at the high level, the level detecting circuit LDTia sets the control signal /SGi at the high level irrespective of a level relationship between the voltage of the power line VDDMi and the reference voltage. Incidentally, the level detecting circuit LDTia changes the reference voltage from a first predetermined voltage (e.g., voltage equivalent to 90% of that of the power line VDD) to a second predetermined voltage (e.g., voltage equivalent to 50% of that of the power line VDD) when the voltage of the power line VDDM1 rises and matches the reference voltage. Further, the level detecting circuit LDTia also changes the reference voltage from the second predetermined voltage to the first predetermined voltage when the control signal /WGi shifts from the low level to the high level.

Figure 6:
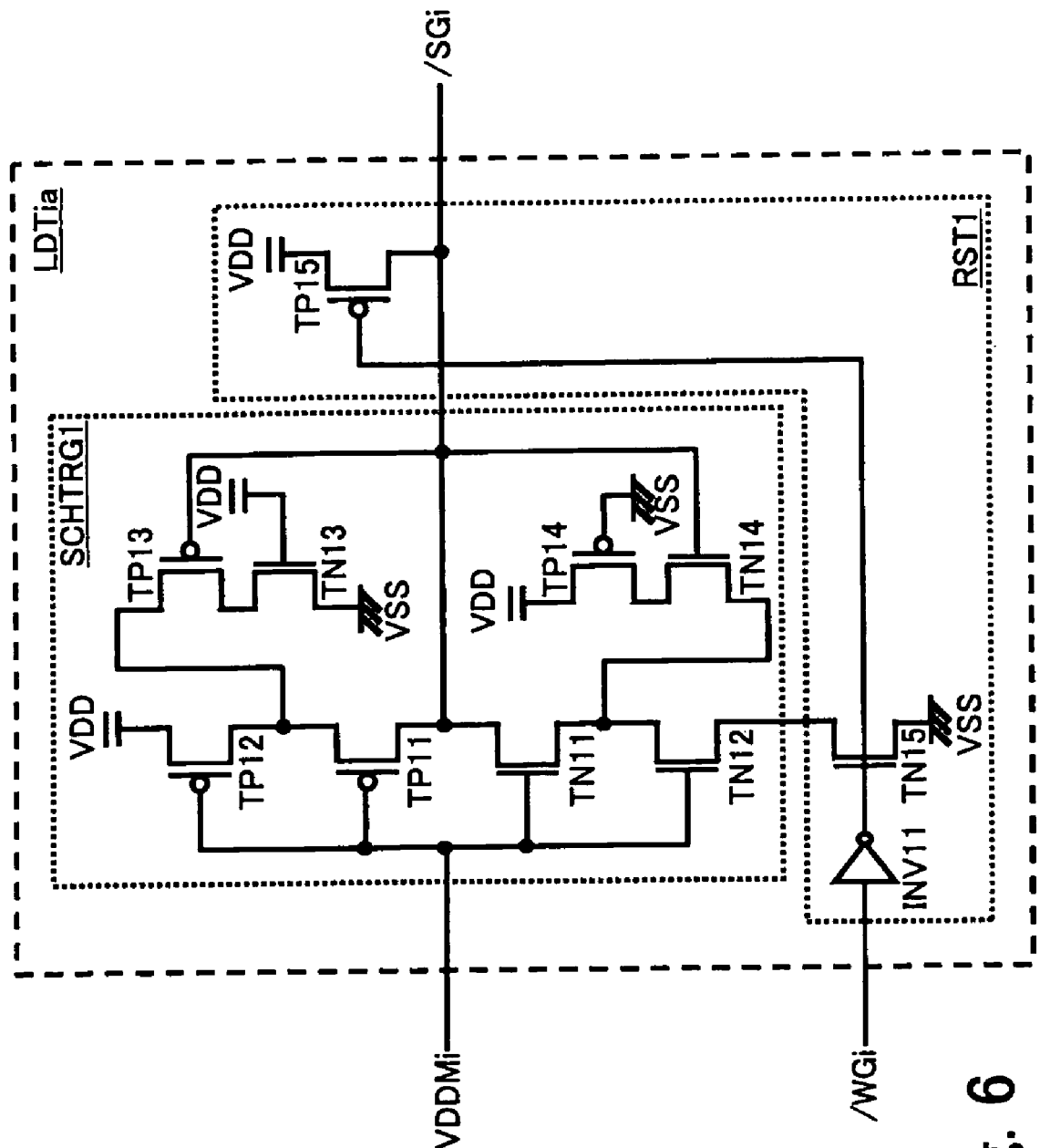
FIG. 6 is an explanatory diagram showing a structure example of a level detecting circuit according to the second embodiment.

FIG. 6 shows an example of the structure of the level detecting circuit LDTia according to the second embodiment. The level detecting circuit LDTia comprises: a Schmitt trigger part SCHTRG1 comprising pMOS transistors TP11 to TP14 and NMOS transistors TN11 to TN14; and a reset part RST1 comprising an inverter INV11, a pMOS transistor TP15, and an NMOS transistor TN15. The pMOS transistors TP12 and TP11 and the NMOS transistors TN11, TN12, and TN15 are serially connected between the power line VDD and the ground line VSS. Gates of the pMOS transistors TP12 and TP11 and the nMOS transistors TN11 and TN12 are connected to the power line VDDMi. A gate of the nMOS transistor TN15 is connected to an output signal line of the inverter INV11. The inverter INV11 inverts the control signal /WGi and outputs the inverted signal. The pMOS transistor TP13 and the nMOS transistor TN13 are serially connected between connection nodes of the pMOS transistors TP11 and TP12 and the ground line VSS. A gate of the pMOS transistor TP13 is connected to a signal line of the control signal /SGi. A gate of the nMOS transistor TN13 is connected to the power line VDD. The pMOS transistor TP14 and the nMOS transistor TN14 are serially connected between the power line VDD and connection nodes of the nMOS transistors TN11 and TN12. A gate of the pMOS transistor TP14 is connected to the ground line VSS. A gate of the nMOS transistor TN 14 is connected to a signal line of the control signal /SGi. The pMOS transistor TP15 is connected between the power line VDD and a signal line of the control signal /SGi. A gate of the pMOS transistor TP15 is connected to an output signal line of the inverter INV11. With the above structure, the level detecting circuit LDTia functions as a reference-voltage-changing-type level detecting circuit.

Figure 7:
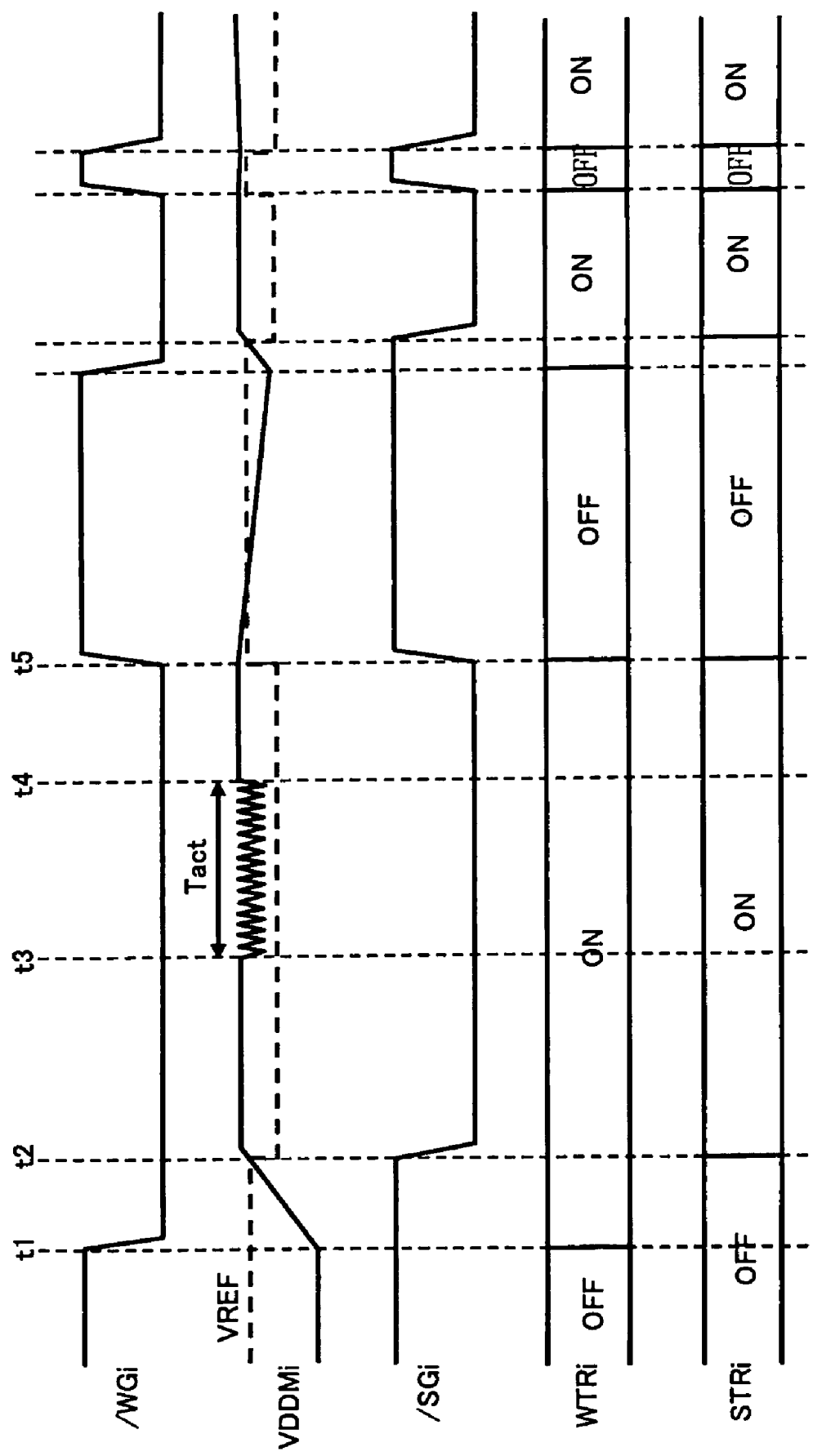
FIG. 7 is an explanatory diagram showing an operation example of a semiconductor device (non-defective product) according the second embodiment.

FIG. 7 shows an operation example of the semiconductor device ICa (non-defective product) according to the second embodiment. FIG. 7 shows the operation example when the power short-circuit does not exist in the semiconductor device ICa. At time t1, the control signal /WGi shifts from the high level to the low level. Then, the power cutoff switch WTRi with a small current-capacity shifts from OFF to ON and the voltage of the power line VDDMi starts to rise. At time t2, the voltage of the power line VDDMi rises and matches a reference voltage VREF (first predetermined voltage) of the level detecting circuit LDTia. Then, the control signal /SGi shifts from the high level to the low level and the power cutoff switch STRi with a large current-capacity shifts from OFF to ON. At this time, the reference voltage VREF of the level detecting circuit LDTia is changed from a first predetermined voltage (voltage equivalent to 90% of that of the power line VDD) to a second predetermined voltage (voltage equivalent to 50% of that of the power line VDD). Therefore, even if noise occurs in the power line VDDMi by the operation of the circuit block BLKi for an operation period Tact of the circuit block BLKi from time t3 to time t4, the voltage of the power line VDDMi is not lower than the reference voltage VREF of the level detecting circuit LDTia. Therefore, it is prevented that the control signal /SGi shifts from the low level to the high level by the noise of the power line VDDMi caused by the operation of the circuit block BLKi and the power cutoff switch STRi shifts from ON to OFF for the operation period Tact of the circuit block BLKi. Further, at the time t1, the power cutoff switch WTRi with a small current-capacity is ON, thereby then gradually rising the voltage of the power line VDDMi. At the time t2, the voltage of the power line VDDMi matches the reference voltage VREF of the level detecting circuit LDTia (first predetermined voltage) and the power cutoff switch STRi with a large current-capacity is thus ON. As a consequence, the noise resulting from inrush current is suppressed. At time t5, the control signal /WGi shifts from the low level to the high level and the power cutoff switch WTRi then shifts from ON to OFF. Further, when the control signal /WGi shifts from the low level to the high level, the control signal /SGi also shifts from the low level to the high level. Therefore, the power cutoff switch STRi shifts from ON to OFF, and the voltage of the power line VDDMi thereafter gradually drops by natural electric discharge. Further, when the control signal /WGi shifts from the low level to the high level, the reference voltage VREF of the level detecting circuit LDTia is changed to the first predetermined voltage from the second predetermined voltage. Thereby, the noise resulting from the inrush current is also suppressed at the next ON-time of the power cutoff switches WTRi and STRi without fail.

Figure 8:
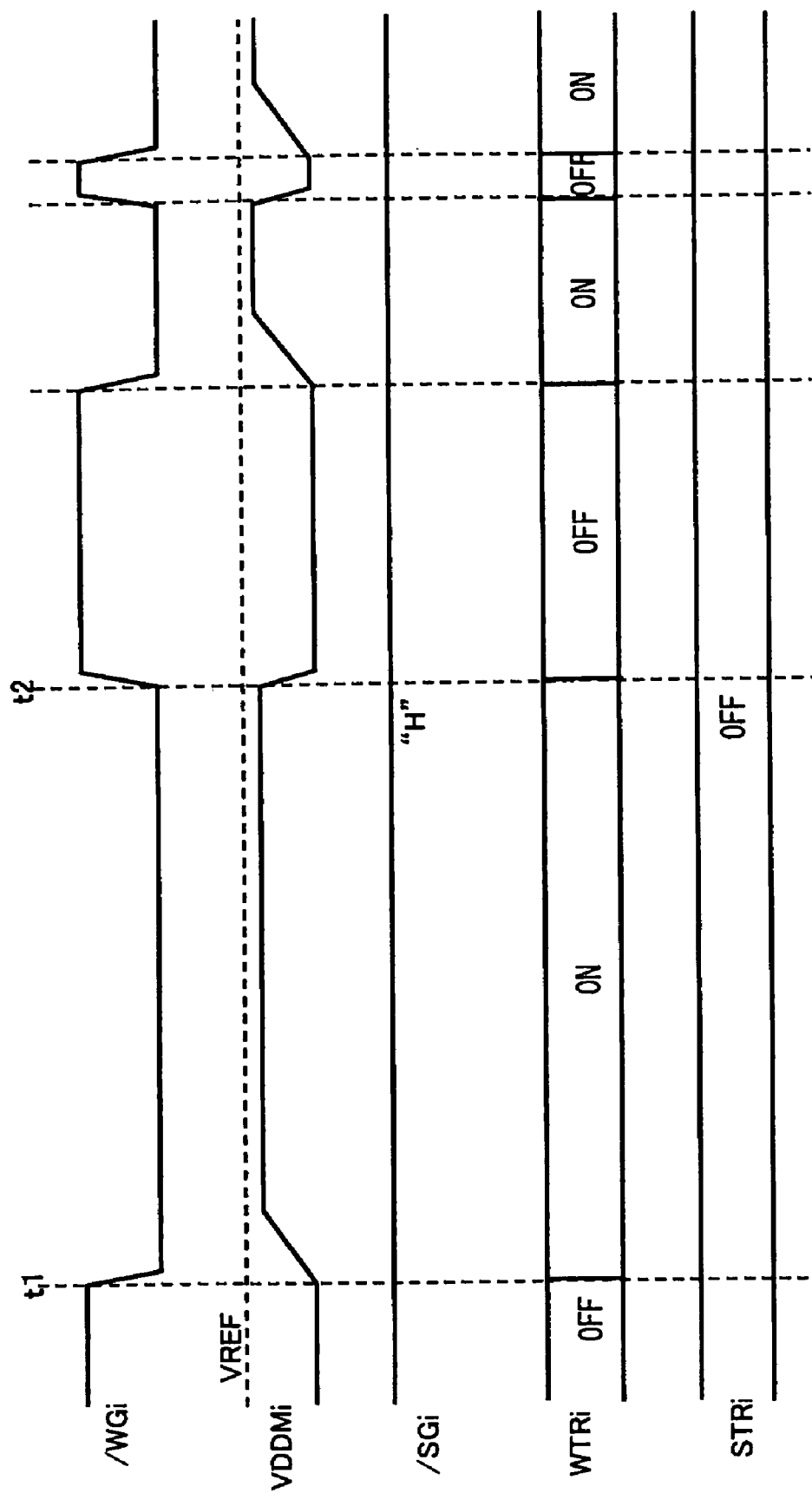
FIG. 8 is an explanatory diagram showing an operation example of a semiconductor device (defective product) according the second embodiment.

FIG. 8 shows an operation example of the semiconductor device ICa (defective product) according to the second embodiment. In the operation example shown in FIG. 8, the power short-circuit exists between the power line VDDMi and the ground line VSS in the semiconductor device ICa. At time t1, the control signal /WGi shifts from the high level to the low level. Then, the power cutoff switch WTRi with a small current-capacity shifts from OFF to ON and the voltage of the power line VDDMi starts to rise. Since the power short-circuit exists between the power line VDDMi and the ground line VSS in the semiconductor device ICa, the voltage of the power line VDDMi stops without the increase to the reference voltage VREF (first predetermined voltage) of the level detecting circuit LDTia, when the drive current of the power cutoff switch WTRi and the current of the power short-circuit are saturated. Therefore, the control signal /SGi does not shift from the high level to the low level and the power cutoff switch STRi with a large current-capacity does not shift from OFF to ON. Accordingly, the external examination environment can be protected without fail. Further, since the ON-current of the power cutoff switch WTRi continues flowing, the defective product having the power short-circuit can be selected by measuring the current. At time t2, the control signal /WGi shifts from the low level to the high level. Then, the power cutoff switch WTRi shifts from ON to OFF. Thereafter, the voltage of the power line VDDMi steeply drops by the power short-circuit between the power line VDDMi and the ground line VSS.

The advantages as those according to the first embodiment are also obtained according to the second embodiment. Further, after the power cutoff switch WTRi with a small current-capacity is ON, the voltage of the power line VDDMi matches the reference voltage VREF (first predetermined voltage) of the level detecting circuit LDTia. Then, since the power cutoff switch STRi with a large current-capacity is ON, the noise resulting from the inrush current can be suppressed and the malfunction of the semiconductor device ICa can be consequently prevented. When the voltage of the power line VDDMi matches the reference voltage VREF, the level detecting circuit LDTia changes the reference voltage VREF from the first predetermined voltage to the second predetermined voltage. Therefore, it is avoidable that the control signal /SGi shifts from the low level to the high level by the noise of the power line VDDMi caused by the operation of the circuit block BLKi and the power cutoff switch STRi shifts from ON to OFF. Further, when the control signal /WGi shifts from the low level to the high level, since the level detecting circuit LDTia changes the reference voltage VREF from the second predetermined voltage to the first predetermined voltage, it is possible to suppress the noise resulting from the inrush current without fail at the next ON-time of the power cutoff switches WTRi and STRi.

Figure 9:
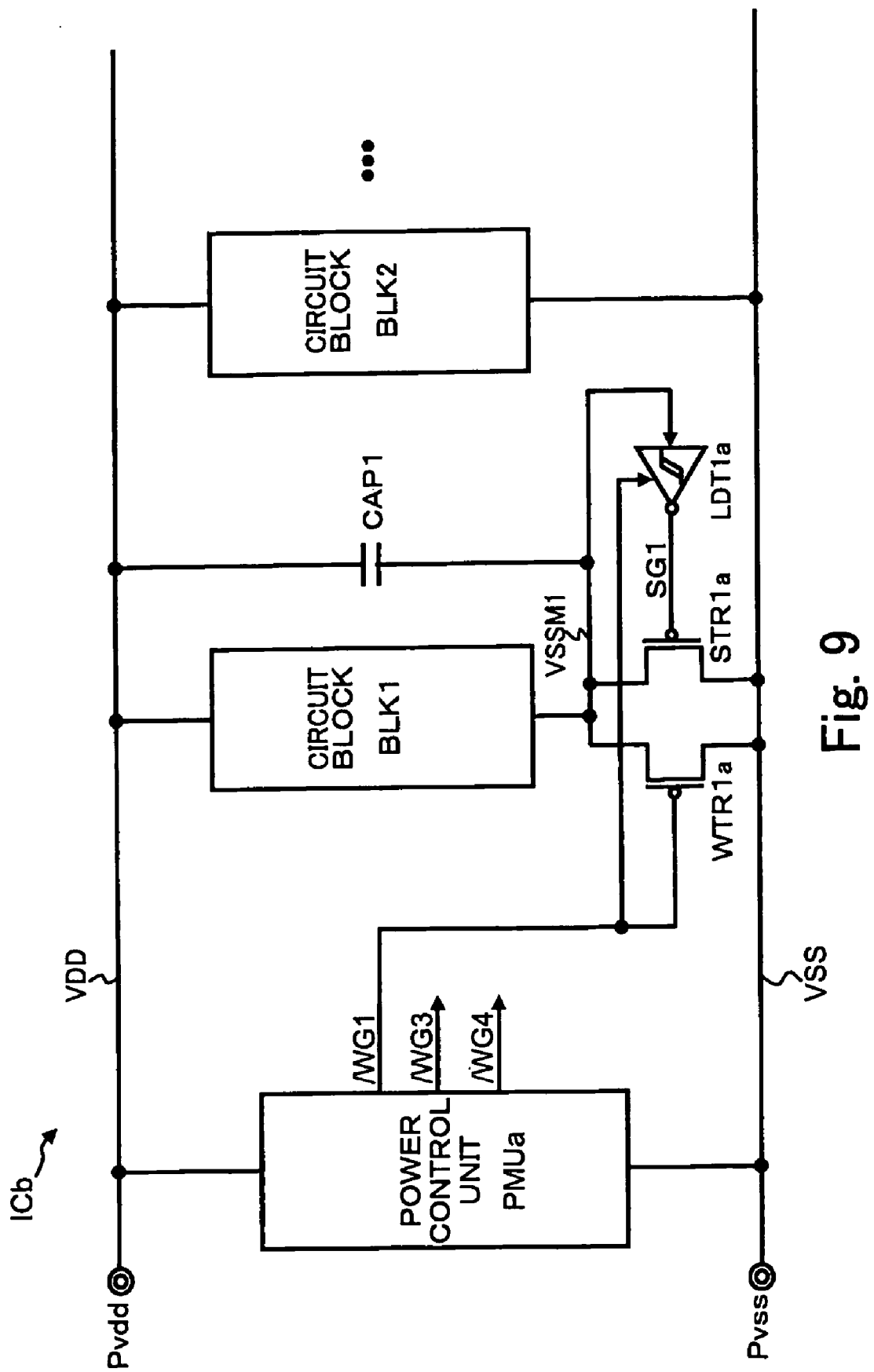
FIG. 9 is an explanatory diagram showing the third embodiment of the present invention.

FIG. 9 shows the third embodiment of the present invention. Incidentally, upon describing the third embodiment, the same numerals as those used according to the first embodiment denote the same components, and the detailed explanation is omitted. A semiconductor device ICb according to the third embodiment comprises circuit blocks BLK1 to BLK5 similarly to the semiconductor device IC according to the first embodiment. Power cutoff functions are provided for circuit blocks BLK1, BLK3, and BLK4 in the semiconductor device ICb, and power cutoff functions of the circuit blocks BLK1, BLK3, and BLK4 are controlled by a power control unit PMUb. The power control unit PMUb sets the control signal WGi at the high level at the operation start of the circuit block BLKi (i=1, 3, 4), and further sets the control signal WGi at the low level at the operation end of the circuit block BLKi. Incidentally, portions relevant to the circuit block BLK1 and BLK2 in the semiconductor device ICb are shown in FIG. 9.

The semiconductor device ICb comprises a stabilization capacitor CAPia, power cutoff switches WTRia and STRia, and a level detecting circuit LDTib, corresponding to the circuit block BLKi. The stabilization capacitor CAPia is connected between the power line VDD and a ground line VSSMi dedicated for the circuit block BLKi. The power cutoff switch WTRia is connected between the ground line VSSMi and the ground line VSS. The power cutoff switch WTRia comprises an nMOS transistor. When the control signal WGi is set at the high, the power cutoff switch WTRia is ON. When the control signal WGi is set at the low level, the power cutoff switch WTRia is OFF. The power cutoff switch WTRia has a current supply capacity having the level at which ON-current can protect the external examination environment. The power cutoff switch STRia is connected between the ground line VSSMi and the ground line VSS, similarly to the power cutoff switch WTRia. The power cutoff switch STRia comprises an NMOS transistor, is ON when a control signal SGi is set at the high level, and is OFF when the control signal SGi is set at the low level. The power cutoff switch STRia has a current supply capacity having the level at which ON-current can supply the consumed electric current of the circuit block BLKi.

When the control signal WGi is set at the high level, the level detecting circuit LDTib sets the control signal SGi at the high level if the voltage of the ground line VSSMi is lower than the reference voltage, and also sets the control signal SGi at the low level if the voltage of the ground line VSSMi is higher than the reference voltage. When the control signal WGi is set at the low level, the level detecting circuit LDTib sets the control signal SGi at the low level, irrespective of a level relationship between the voltage of the ground line VSSMi and the reference voltage. Incidentally, the voltage of the ground line VSSMi drops and matches the reference voltage, the level detecting circuit LDTib then changes the reference voltage from a first predetermined voltage (e.g., voltage equivalent to 10% of that of the power line VDD) to a second predetermined voltage (e.g., voltage equivalent to 50% of that of the power line VDD). When the control signal WGi shifts from the high level to the low level, the level detecting circuit LDTib changes the reference voltage to the first predetermined voltage from the second predetermined voltage.

Figure 10:
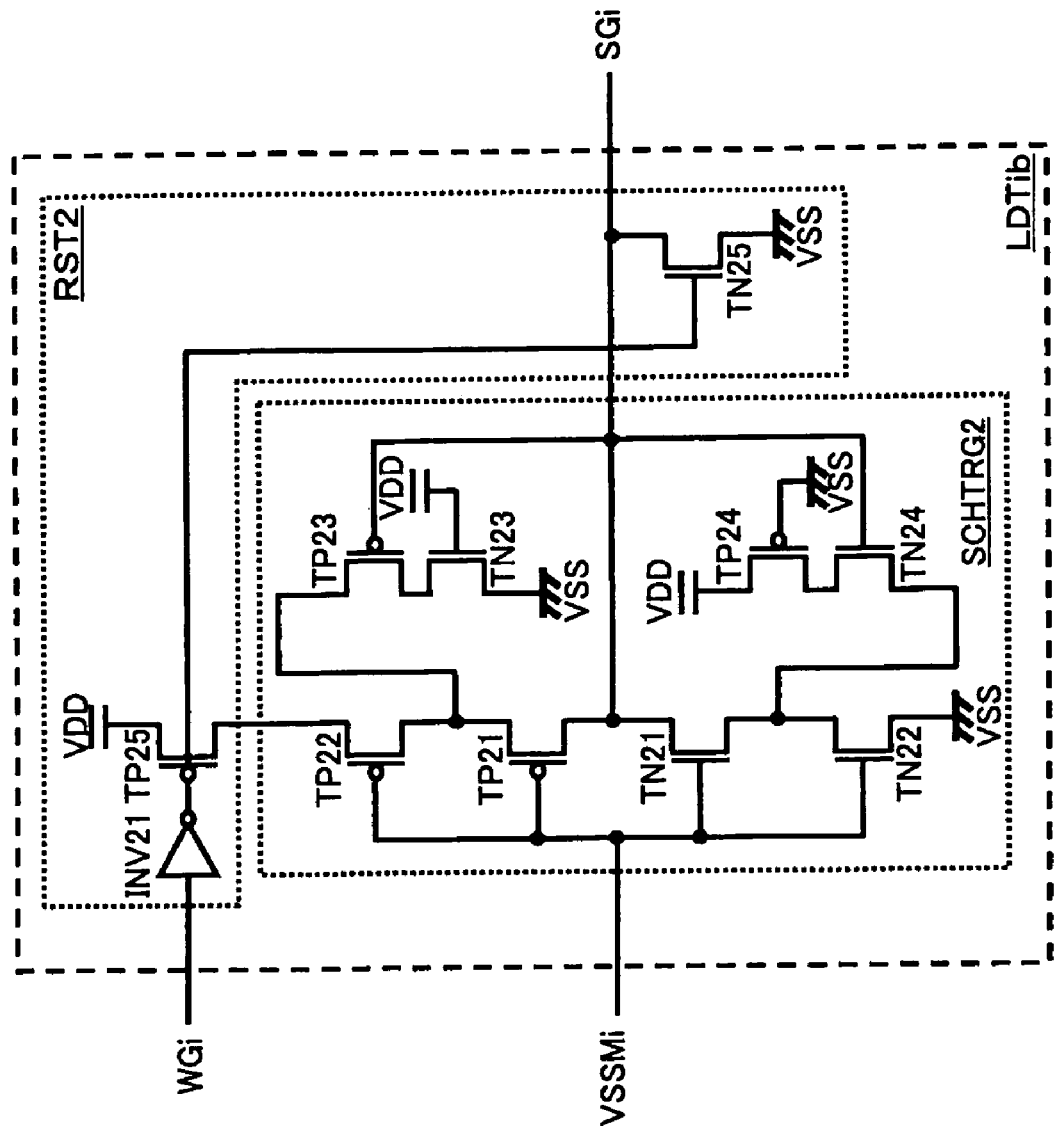
FIG. 10 is an explanatory diagram showing a structure example of a level detecting circuit according to the third embodiment.

FIG. 10 shows an example of the structure of the level detecting circuit LDTib according to the third embodiment. The level detecting circuit LDTib comprises a Schmitt trigger part SCHTRG2 comprising pMOS transistors TP21 to TP24 and NMOS transistors TN21 to TN24, and a reset part RST2 comprising an inverter INV21, a pMOS transistor TP25, and an NMOS transistor TN25. The pMOS transistors TP25, TP22, TP21 and the nMOS transistors TN21 and TN22 are serially connected between the power line VDD and the ground line VSS. Gates of the pMOS transistors TP22 and TP21 and the nMOS transistors TN21 and TN22 are connected to the ground line VSSMi. A gate of the pMOS transistor TP25 is connected to an output signal line of the inverter INV21. The inverter INV21 inverts the control signal WGi and outputs the inverted signal. The pMOS transistor TP23 and the nMOS transistor TN23 are serially connected between connection nodes of the pMOS transistors TP21 and TP22 and the ground line VSS. A gate of the pMOS transistor TP23 is connected to a signal line of the control signal SGi. A gate of the nMOS transistor TN23 is connected to the power line VDD. The pMOS transistor TP24 and the nMOS transistor TN24 are serially connected between the power line VDD and connection nodes of the nMOS transistors TN21 and TN22. A gate of the pMOS transistor TP24 is connected to the ground line VSS. A gate of the nMOS transistor TN24 is connected to the signal line of the control signal SGi. The NMOS transistor TN25 is connected between the signal line of the control signal SGi and the ground line VSS. A gate of the NMOS transistor TN25 is connected to the output signal line of the inverter INV21. With the above structure, the level detecting circuit LDTib functions as a reference-voltage-changing-type level detecting circuit.

Figure 11:
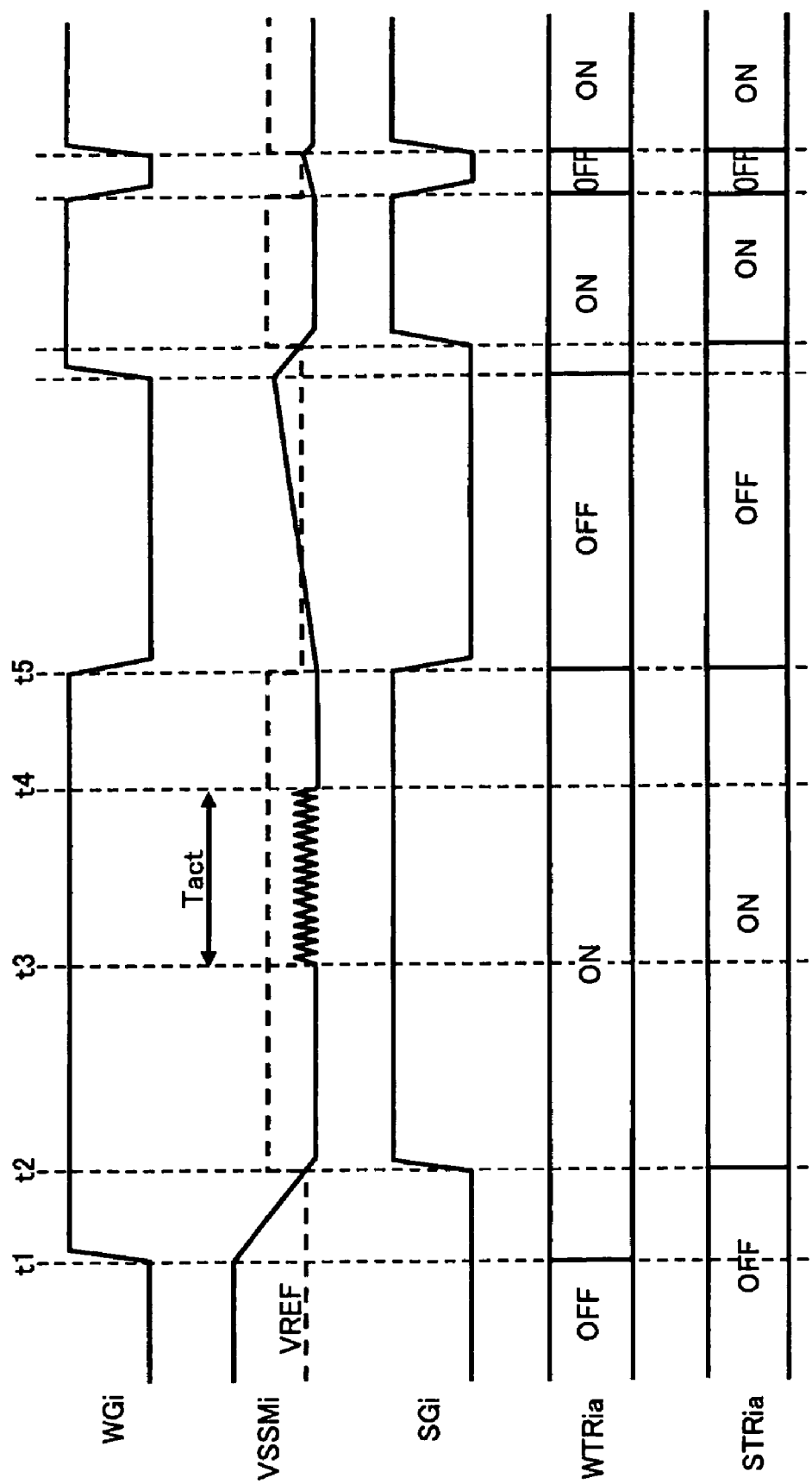
FIG. 11 is an explanatory diagram showing an operation example of a semiconductor device (non-defective product) according to the third embodiment.

FIG. 11 shows an operation example of a semiconductor device ICb (non-defective product) according to the third embodiment. In the operation example shown in FIG. 11, the power short-circuit does not exist in the semiconductor device ICb. At time t1, the control signal WGi shifts from the low level to the high level, the power cutoff switch WTRia with a small current-supply capacity then shifts from OFF to ON, and the voltage of the ground line VSSMi starts to drop. At time t2, the voltage of the ground line VSSMi drops and matches a reference voltage VREF (first predetermined voltage) of the level detecting circuit LDTib. Then, the control signal SGi shifts from the low level to the high level, and the power cutoff switch STRia with a large current-supply capacity shifts from OFF to ON. At this time, the reference voltage VREF of the level detecting circuit LDTib is changed from a first predetermined voltage (voltage equivalent to 10% of that of the power line VDD) to a second predetermined voltage (voltage equivalent to 50% of that of the power line VDD). Therefore, even if the noise occurs at the ground line VSSMi by an operation of the circuit block BLKi for an operation period Tact of the circuit block BLKi from time t3 to time t4, the voltage of the ground line VSSMi is not higher than the reference voltage VREF of the level detecting circuit LDTib. Accordingly, it is prevented for the operation period Tact of the circuit block BLKi that the control signal SGi shifts from the high level to the low level by the noise of the ground line VSSMi caused by the operation of the circuit block BLKi and the power cutoff switch STRia shifts from ON to OFF. At time t1, the power cutoff switch WTRia with a small current-supply capacity is ON. Thereafter, the voltage of the ground line VSSMi gradually drops and the voltage of the ground line VSSMi matches the reference voltage VREF of the level detecting circuit LDTib (first predetermined voltage) at time t2. Since the power cutoff switch STRia with a large current-supply capacity is ON, the noise resulting from inrush current is suppressed. At time t5, the control signal WGi shifts from the high level to the low level. Then, the power cutoff switch WTRia shifts from ON to OFF. Further, if the control signal WGi shifts from the high level to the low level, the control signal SGi also shifts from the high level to the low level and the power cutoff switch STRia shifts from ON to OFF. Thereafter, the voltage of the ground line VSSMi gradually rises by natural charge. Furthermore, if the control signal WGi shifts from the high level to the low level, the reference voltage VREF of the level detecting circuit LDTib is changed to the first predetermined voltage from the second predetermined voltage. Thereby, the noise resulting from inrush current is also suppressed without fail at the next ON-time of the power cutoff switches WTRia and STRia.

Figure 12:
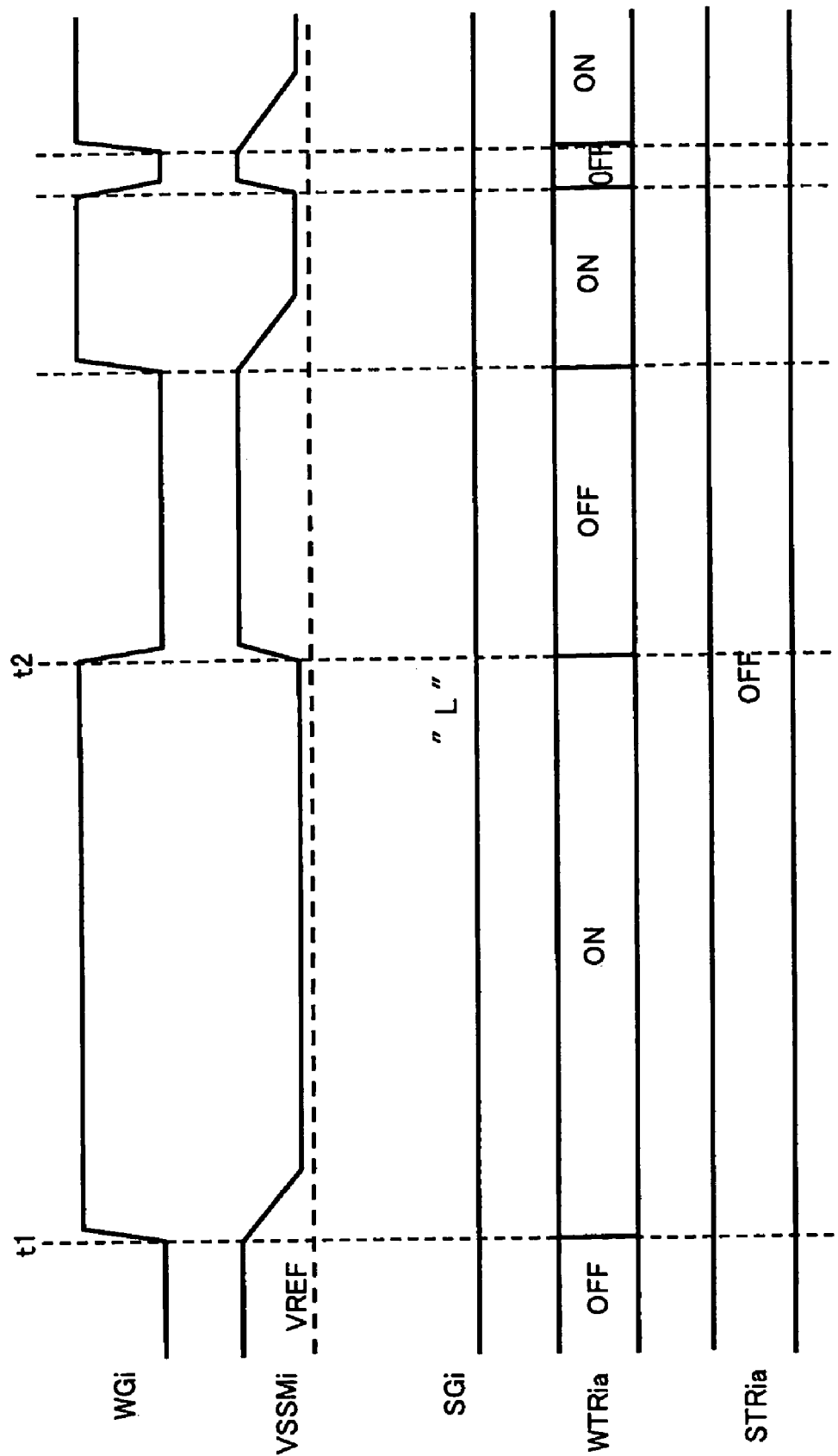
FIG. 12 is an explanatory diagram showing an operation example of a semiconductor device (defective product) according to the third embodiment.

FIG. 12 shows an operation example of the semiconductor device ICb (defective product) according to the third embodiment. In the operation example shown in FIG. 12, the power short-circuit exists between the power line VDD and the ground line VSSMi in the semiconductor device ICb. At time t1, the control signal WGi shifts from the low level to the high level. Then, the power cutoff switch WTRia with a small current-supply capacity shifts from OFF to ON and the voltage of the ground line VSSMi starts to drop. Since the power short-circuit exists between the power line VDD and the ground line VSSMi in the semiconductor device ICb, the voltage of the ground line VSSMi stops without dropping to the reference voltage VREF (first predetermined voltage) of the level detecting circuit LDTib, when drive current of the power cutoff switch WTRia and the current of the power short-circuit are saturated. Therefore, the control signal SGi does not shift from the low level to the high level, and the power cutoff switch STRia with a large current-supply capacity does not shift from OFF to ON, thereby protecting the external examination environment without fail. Further, since ON-current of the power cutoff switch WTRia continues flowing, the defective product having the power short-circuit can be selected by measuring the current. At time t2, the control signal WGi shifts from the high level to the low level. Then, the power cutoff switch WTRia shifts from ON to OFF, and the voltage of the ground line VSSMi thereafter rises steeply by the power short-circuit between the power line VDD and the ground line VSSMi.

As mentioned above, with the structure of the power cutoff switch having the NMOS transistor on the ground line VSS side of the circuit block BLKi according to the third embodiment, the same advantages as those according to the second embodiment are obtained. According to the third embodiment, the power cutoff switch comprising the NMOS transistor is disposed on the ground line VSS side of the circuit block BLKi. However, the present invention is not limited to this embodiment, and a power cutoff switch comprising a pMOS transistor may be disposed on the ground line VSS side of the circuit block BLKi.

Figure 13:
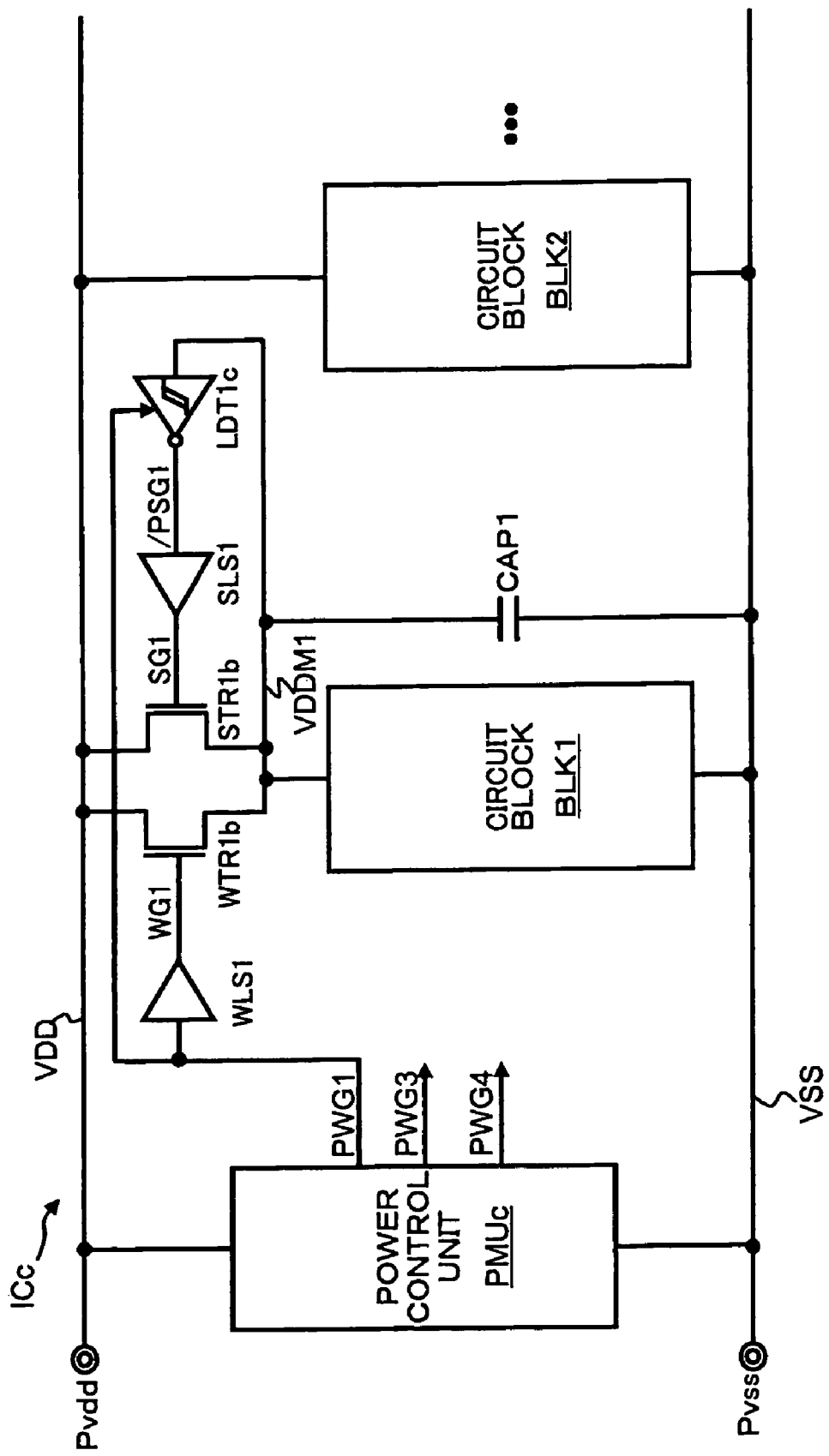
FIG. 13 is an explanatory diagram showing the fourth embodiment of the present invention.

FIG. 13 shows the fourth embodiment of the present invention. Incidentally, upon describing the fourth embodiment, the same numerals as those according to the first embodiment denote the same components as those according to the first embodiment, and the detailed explanation is omitted. A semiconductor device ICc according to the fourth embodiment comprises circuit blocks BLK1 to BLK5, similarly to the semiconductor device IC according to the first embodiment. Power cutoff functions are provided for circuit blocks BLK1, BLK3, and BLK4 in the semiconductor device ICc, and the power cutoff functions of the circuit block BLK1, BLK3, and BLK4 are controlled by a power control unit PMUc. The power control unit PMUc sets the control signal PWGi at the high level at the operation start of the circuit block BLKi (i=1, 3, 4), and further sets the control signal PWGi at the low level at the operation end of the circuit block BLKi. Incidentally, portions relevant to the circuit blocks BLK1 and BLK2 in the semiconductor device ICc are shown in FIG. 13.

The semiconductor device ICc comprises a stabilization capacitor CAPi, power cutoff switches WTRib and STRib, a level detecting circuit LDTic, and level shifters WLSi and STSi, corresponding to the circuit block BLKi. The power cutoff switch WTRib is connected between the power line VDD and the power line VDDMi dedicated for the circuit block BLKi. The power cutoff switch WTRib comprises an NMOS transistor having a high threshold, and is ON when the control signal WGi is set at the high level, and is OFF when the control signal WGi is set at the low level. The power cutoff switch WTRib has a current supply capacity having the level at which ON-current can protect the external examination environment. Similarly to the power cutoff switch WTRib, the power cutoff switch STRib is connected between the power line VDD and the power line VDDMi. The power cutoff switch STRib comprises an nMOS transistor having a high threshold, and is ON when the control signal SGi is set at the high level, and is OFF when the control signal SGi is set at the low level. The power cutoff switch STRib has a current-supply capacity having the level at which ON-current can supply the consumed electric current of the circuit block BLKi.

When the control signal PWGi is set at the high level, the level detecting circuit LDTic sets the control signal /PSGi at the low level if the voltage of the power line VDDMi is higher than the reference voltage, and also sets the control signal /PSGi at the high level if the voltage of the power line VDDMi is lower than the reference voltage. The level detecting circuit LDTic sets the control signal /PSGi at the high level irrespective of a level relationship between the voltage of the power line VDDMi and the reference voltage, when the control signal PWGi is set at the low level. Incidentally, the level detecting circuit LDTic changes the reference voltage from a first predetermined voltage (e.g., voltage equivalent to 90% of that of the power line VDD) to a second predetermined voltage (e.g., voltage equivalent to 50% of that of the power line VDD) when the voltage of the power line VDDMi rises and matches the reference voltage. When the control signal PWGi shifts from the high level to the low level, the level detecting circuit LDTic changes the reference voltage from the second predetermined voltage to the first predetermined voltage.

The level shifter WLSi embodies the level shift to the high level of the control signal PWGi, and generates the control signal WGi. A voltage corresponding to the high level of the control signal WGi is higher than the voltage of the power line VDD, and a voltage corresponding to the low level of the control signal WGi is a voltage of the ground line VSS. The level shifter SLSi embodies the level shift to the high level of an inversion signal of the control signal /PSGi, and generates the control signal SGi. A voltage corresponding to the high level of the control signal SGi is higher than the voltage of power line VDD, and a voltage corresponding to the low level of the control signal SGi is a voltage of the ground line VSS.

Figure 14:
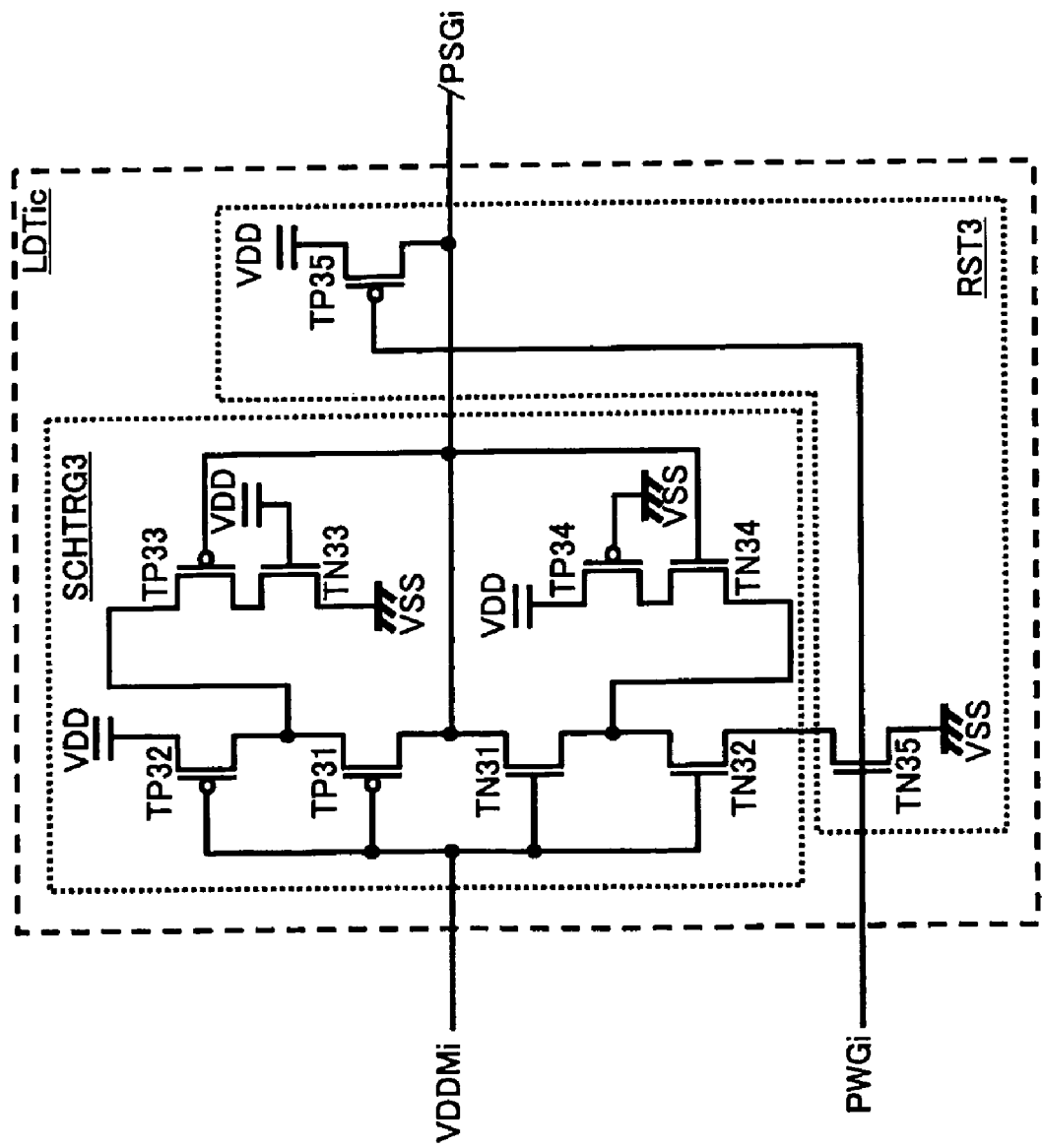
FIG. 14 is an explanatory diagram showing a structure example of a level detecting circuit according to the fourth embodiment.

FIG. 14 shows an example of the structure of the level detecting circuit LDTic according to the fourth embodiment. The level detecting circuit LDTic comprises a Schmitt trigger part SCHTRG3 comprising pMOS transistors TP31 to TP34 and nMOS transistors TN31 to TN34, and a reset part RST3 comprising a pMOS transistor TP35 and an NMOS transistor TN35. The pMOS transistors TP32 and TP31 and the NMOS transistors TN31, TN32, and TN35 are serially connected between the power line VDD and the ground line VSS. Gates of the pMOS transistors TP32 and TP31 and the nMOS transistor TN31 and TN32 are connected to the power line VDDMi. A gate of the nMOS transistor TN35 is connected to a signal line of the control signal PWGi. The pMOS transistor TP33 and the nMOS transistor TN33 are serially connected between connection nodes of the pMOS transistors TP31 and TP32 and the ground line VSS. A gate of the pMOS transistor TP33 is connected to a signal line of the control signal /PSGi. A gate of the nMOS transistor TN33 is connected to the power line VDD. The pMOS transistor TP34 and nMOS transistor TN34 are serially connected between the power line VDD and connection nodes of the nMOS transistors TN31 and TN32. A gate of the pMOS transistor TP34 is connected to the ground line VSS. A gate of the nMOS transistor TN34 is connected to the signal line of the control signal /PSGi. The pMOS transistor TP35 is connected between the power line VDD and the signal line of the control signal /PSGi. A gate of the pMOS transistor TP35 is connected to the signal line of the control signal PWGi. With the above structure, the level detecting circuit LDTic functions as a reference-voltage-changing-type level detecting circuit.

Figure 15:
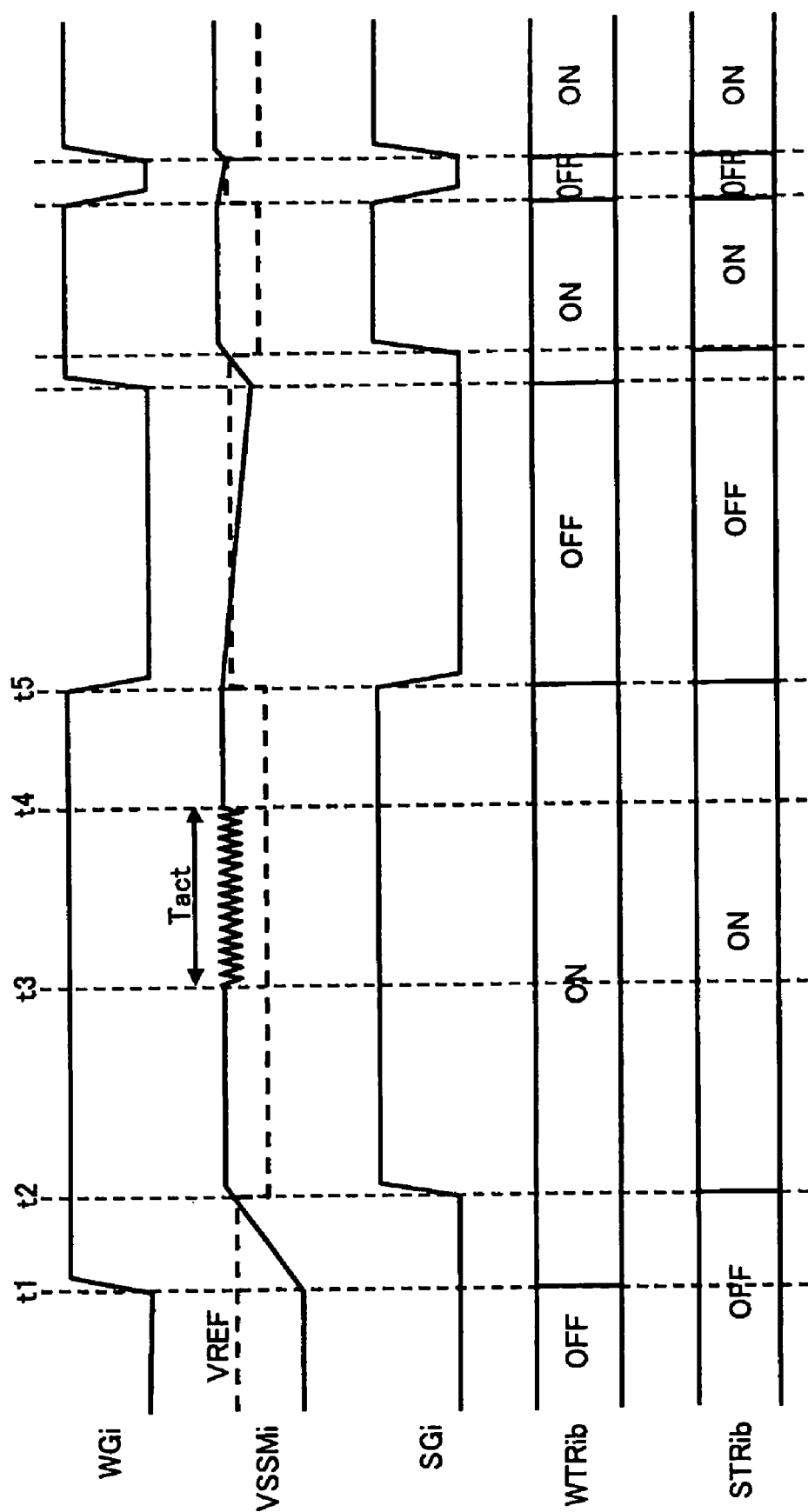
FIG. 15 is an explanatory diagram showing an operation example of a semiconductor device (non-defective product) according to the fourth embodiment.

FIG. 15 shows an operation example of the semiconductor device ICc (non-defective product) according to the fourth embodiment. In the operation example shown in FIG. 15, the power short-circuit does not exist in the semiconductor device ICc. At time t1, the control signal WGi shifts from the low level to the high level. Then, the power cutoff switch WTRib with a small current-supply capacity shifts from OFF to ON, and the voltage of the power line VDDMi starts to rise. At time t2, the voltage of the power line VDDMi rises and matches the reference voltage VREF of the level detecting circuit LDTic (first predetermined voltage). Then, the control signal SGi shifts from the low level to the high level, and the power cutoff switch STRib with a large current-supply capacity shifts from OFF to ON. At the time, the reference voltage VREF of the level detecting circuit LDTic is changed from a first predetermined voltage (voltage equivalent to 90% of that of the power line VDD) to a second predetermined voltage (voltage equivalent to 50% of that of the power line VDD).

Therefore, even if noise occurs in the power line VDDMi by the operation of the circuit block BLKi for an operation period Tact of the circuit block BLKi from time t3 to time t4, the voltage of the power line VDDMi is not lower than the reference voltage VREF of the level detecting circuit LDTic. Accordingly, it is prevented that the control signal SGi shifts from the high level to the low level by the noise of the power line VDDMi caused by the operation of the circuit block BLKi and the power cutoff switch STRib shifts from ON to OFF for the operation period Tact of the circuit block BLKi. At time t1, the power cutoff switch WTRib with a small current-supply capacity is ON, thereby thereafter increasing the voltage of the power line VDDMi gradually. At time t2, the voltage of the power line VDDMi matches the reference voltage VREF (first predetermined voltage) of the level detecting circuit LDTic and then the power cutoff switch STRib with a large current-supply capacity is ON. Thereby, the noise resulting from inrush current is suppressed. At time t5, the control signal WGi shifts from the high level to the low level, the power cutoff switch WTRib shifts from ON to OFF. Further, if the control signal WGi shifts from the high level to the low level, the control signal SGi also shifts from the high level to the low level. Therefore, the power cutoff switch STRib also shifts from ON to OFF, and the voltage of the power line VDDMi thereafter drops gradually by natural electric discharge. Furthermore, if the control signal WGi shifts from the high level to the low level, the reference voltage VREF of the level detecting circuit LDTic is changed to the first predetermined voltage from the second predetermined voltage. Thereby, the noise resulting from inrush current is suppressed without fail at the next ON-time of the power cutoff switches WTRib and STRib.

Figure 16:
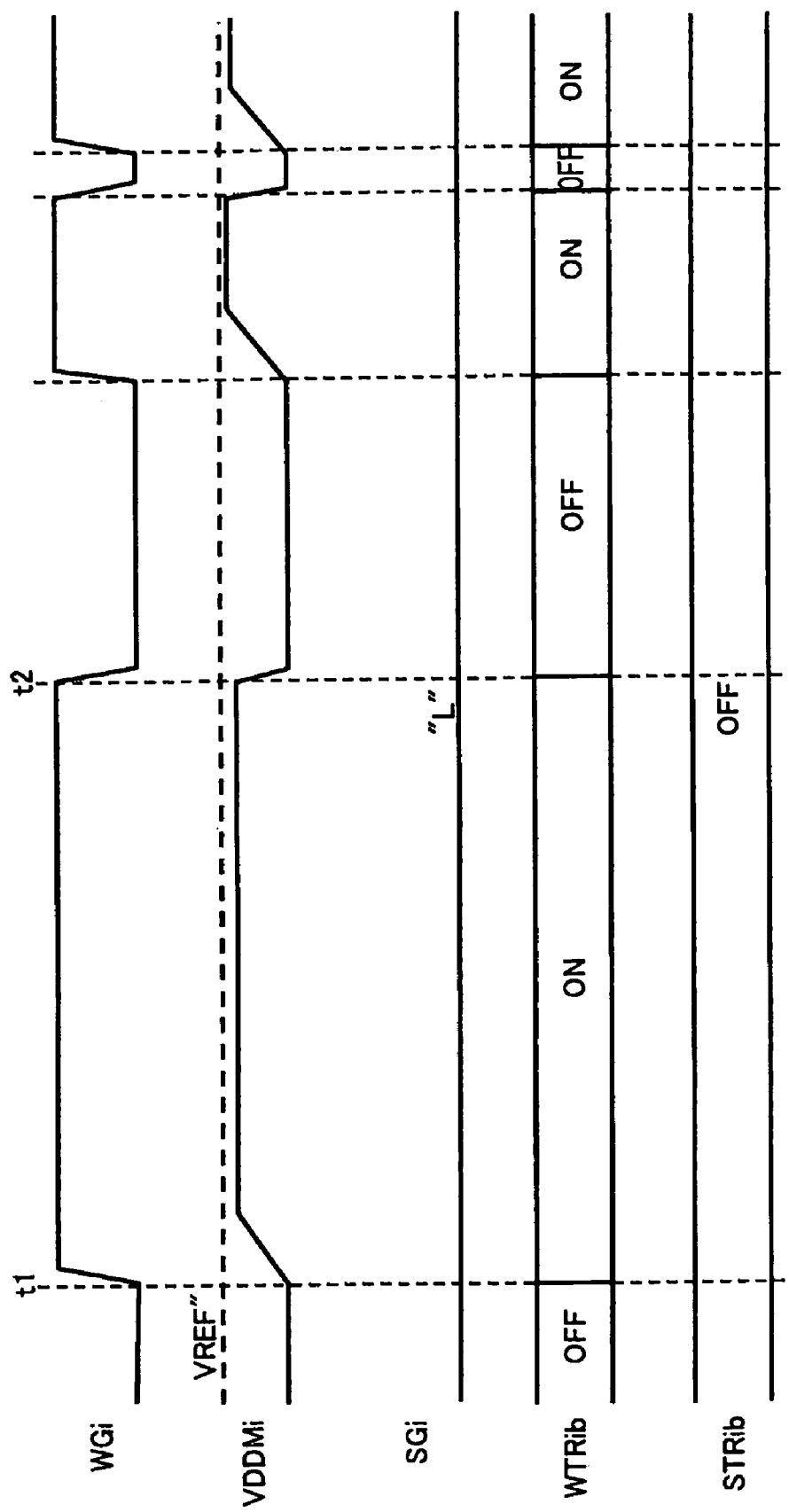
FIG. 16 is an explanatory diagram showing an operation example of a semiconductor device (defective product) according to the fourth embodiment.

FIG. 16 shows an operation example of the semiconductor device ICc (defective product) according to the fourth embodiment. In the operation example shown in FIG. 16, the power short-circuit exists between the power line VDDMi and the ground line VSS in the semiconductor device ICc. At time t1, the control signal WGi shifts from the low level to the high level. Then, the power cutoff switch WTRib with a small current-supply capacity shifts from OFF to ON and the voltage of the power line VDDMi starts to rise. Since the power short-circuit exists between the power line VDDMi and the ground line VSS in the semiconductor device ICc, the voltage of the power line VDDMi stops without the increase up to the reference voltage VREF (first predetermined voltage) of the level detecting circuit LDTic, when drive current of the power cutoff switch WTRib and the current of the power short-circuit are saturated. Therefore, the control signal SGi does not shift from the low level to the high level, and the power cutoff switch STRib with a large current-supply capacity does not shift from OFF to ON. Accordingly, the external examination environment can be protected without fail. Further, since ON-current of the power cutoff switch WTRib continues flowing, the defective product having the power short-circuit can be selected by measuring the current. At time t2, the control signal WGi shifts from the high level to the low level. Then, the power cutoff switch WTRi shifts from ON to OFF, and the voltage of the power line VDDMi thereafter drops steeply by the power short-circuit between the power line VDDMi and the ground line VSS.

As mentioned above, with the structure of the power cutoff switch having the NMOS transistor disposed on the ground line VDD side of the circuit block BLKi according to the fourth embodiment, the same advantages as those according to the second embodiment are obtained.

Figure 17:
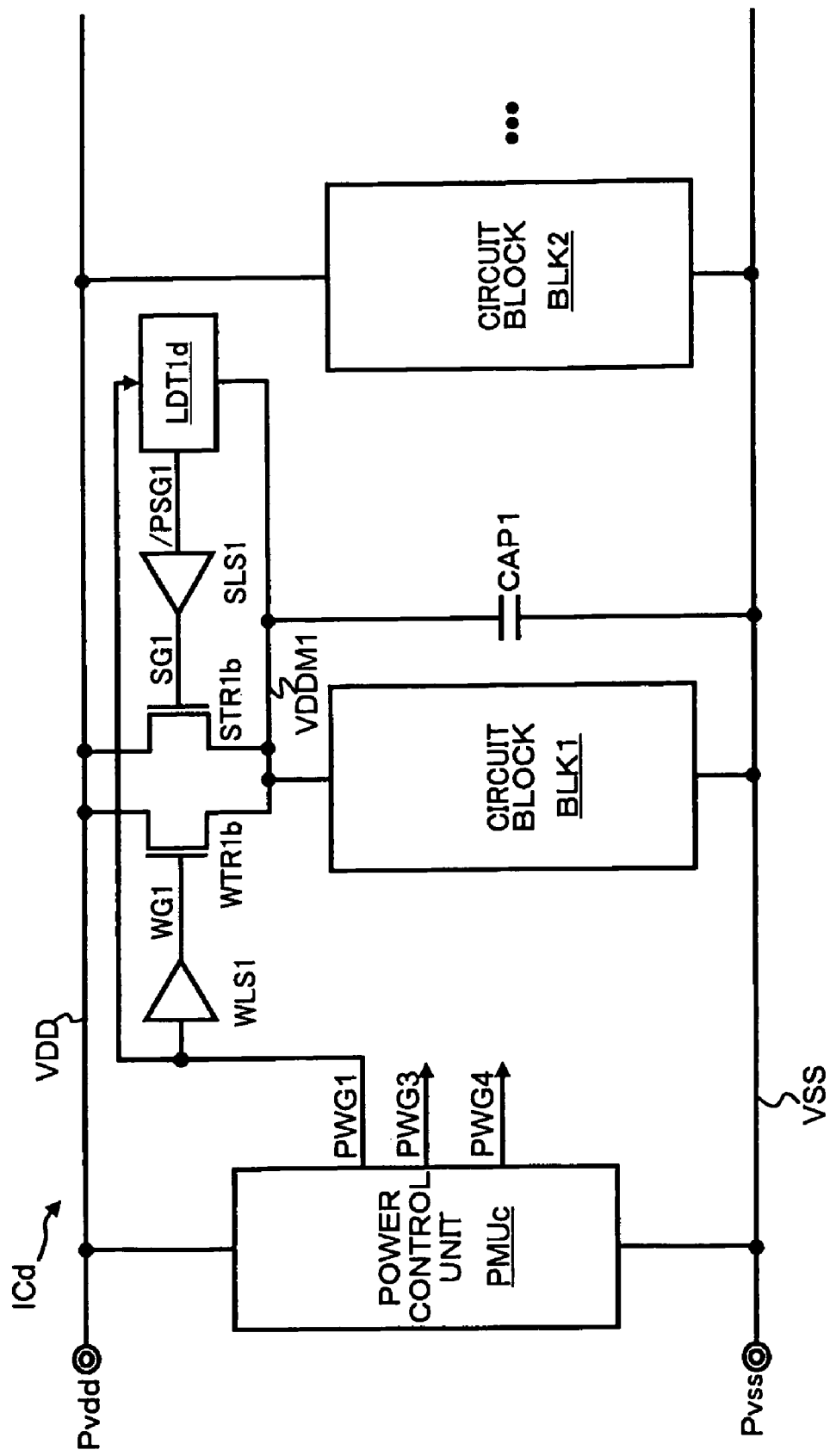
FIG. 17 is an explanatory diagram showing the fifth embodiment of the present invention.

FIG. 17 shows the fifth embodiment of the present invention. Incidentally, upon describing the fifth embodiment, the same numerals as those according to the first embodiment denote the same components as those according to the first embodiment, and the detailed explanation is omitted. A semiconductor device ICd according to the fifth embodiment is structured by replacing the level detecting circuit (i=1, 3, 4) LDTic with a level detecting circuit LDTid in the semiconductor device ICc according to the forth embodiment. Incidentally, portions relevant to the circuit block BLK1 and BLK2 in the semiconductor device ICd are shown in FIG. 17. When the voltage of the power line VDDMi rises and matches the reference voltage (e.g., voltage equivalent to 90% of that of the power line VDD), the level detecting circuit LDTid shifts the control signal /PSGi from the high level to the low level. When the control signal PWG shifts from the high level to the low level, the level detecting circuit LDTid shifts the control signal /PSGi from the low level to the high level.

Figure 18:
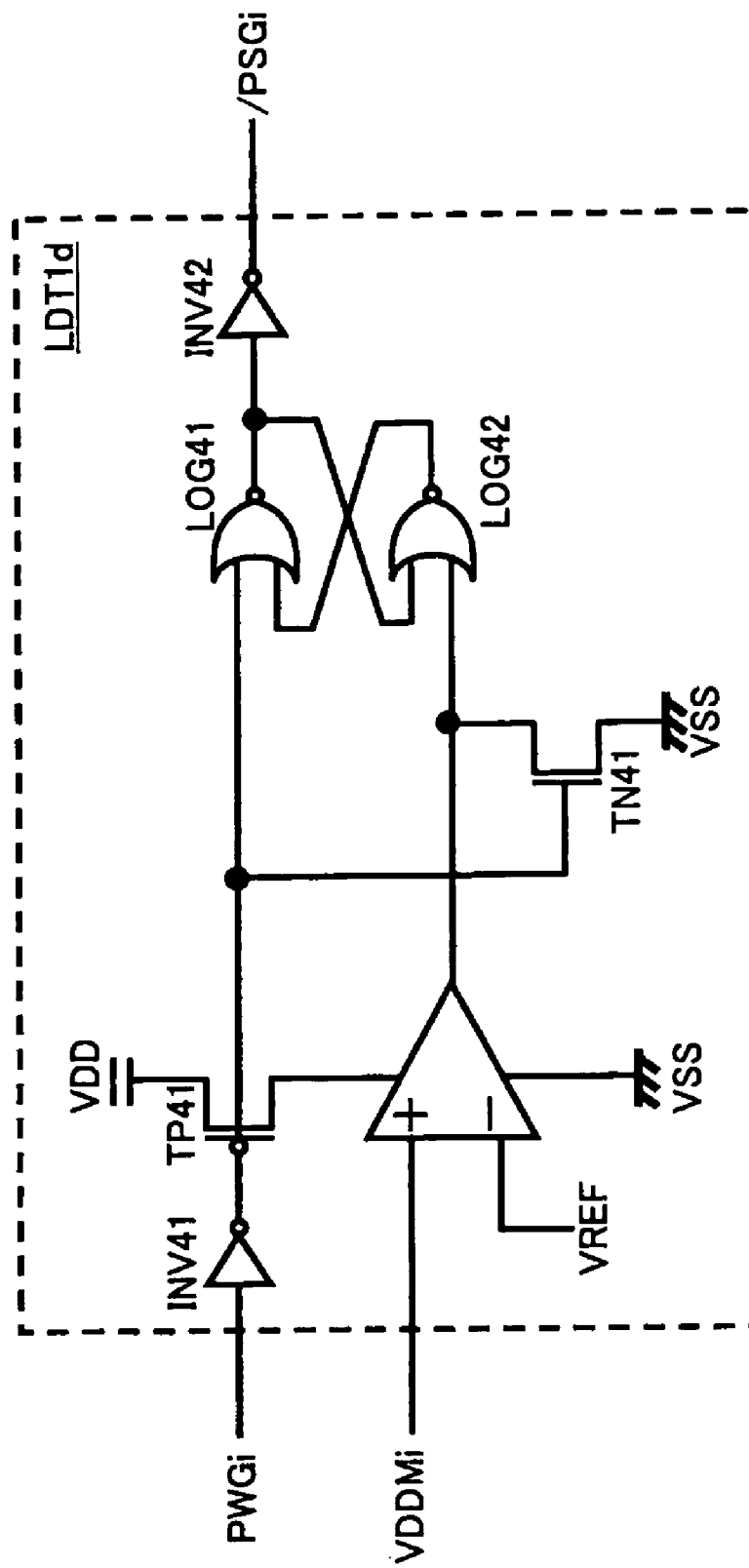
FIG. 18 is an explanatory diagram showing a structure example of a level detecting circuit according to the fifth embodiment.

FIG. 18 shows an example of the structure of the level detecting circuit LDTid according to the fifth embodiment. The level detecting circuit LDTid comprises inverters INV41 and INV42, a pMOS transistor TP41, a voltage comparator VC41, an NMOS transistor TN41, and logical circuits LOG41, and LOG42. The inverter INV41 inverts the control signal PWGi and outputs the inverted signal. A non-inverse input terminal of the voltage comparator VC41 is connected to the power line VDDMi, and an inverse input terminal of the voltage comparator VC41 is connected to a supply line of a reference voltage VREF (voltage equivalent to 90% of that of the power line VDD). Further, a power terminal of the voltage comparator VC41 is connected to the power line VDD via the pMOS transistor TP41, and a ground terminal of the voltage comparator VC41 is connected to the ground line VSS. A gate of the pMOS transistor TP41 is connected to an output signal line of the inverter INV41. Accordingly, when the pMOS transistor TP41 is ON (when the control signal PWGi is set at the high level), the voltage comparator VC41 sets an output signal at the high level if the voltage of the power line VDDMi is higher than the reference voltage VREF. The voltage comparator VC41 sets an output signal at the low level if the voltage of the power line VDDMi is lower than the reference voltage VREF. Further, when the pMOS transistor TP41 is OFF (when the control signal PWGi is set at the low level), the voltage comparator VC41 stops the driving of the output signal line thereof. The nMOS transistor TN41 is connected between the output signal line of the voltage comparator VC41 and the ground line VSS. The gate of nMOS transistor TN41 is connected to the output signal line of the inverter INV41. Accordingly, when the control signal PWGi is set at the high level, an output signal line of the voltage comparator VC1 is driven at the high/low level depending on a level relationship between the voltage of the power line VDDMi and the reference voltage VREF by the voltage comparator VC41. When the control signal PWGi is set at the low level, the output signal line of the voltage comparator VC1 is driven to the low level by the nMOS transistor TN41. When at least one of the output signal of the inverter INV41 and the output signal of a logical circuit LOG42 is set at the high level, a logical circuit LOG41 sets the output signal at the low level. When both the output signal of the inverter INV41 and the output signal of the logical circuit LOG42 are set at the low level, the logical circuit LOG41 sets the output signal at the high level. When at least one of the output signal of the logical circuit LOG41 and the output signal of the voltage comparator VC41 is set at the high level, the logical circuit LOG42 sets the output signal at the low level. When both the output signal of the logical circuit LOG41 and the output signal of the voltage comparator VC41 are set at the low level, the logical circuit LOG42 sets the output signal at the high level. That is, if the output of the voltage comparator VC41 shifts from the low level to the high level (the voltage of the power line VDDMi matches the reference voltage VREF), the logical circuits LOG41 and LOG42 shift from a reset mode to a set mode. If the output signal of the inverter INV41 shifts from the low level to the high level (the control signal PWGi shifts from the high level to the low level), the logical circuits LOG41 and LOG42 shift from the set mode to the reset mode. That is, the logical circuits LOG41 and LOG42 function as a set/reset circuit. The inverter INV42 inverts the output signal of the logical circuit LOG41, and outputs the inverted signal as the control signal /PSGi. Also with the level detecting circuit LDTid with the structure, the same functions thereof as those of the level detecting circuit LDTic according to the fourth embodiment are realized. Accordingly, the same advantages as those according to the fourth embodiment are also obtained according to the fifth embodiment.

Figure 19:
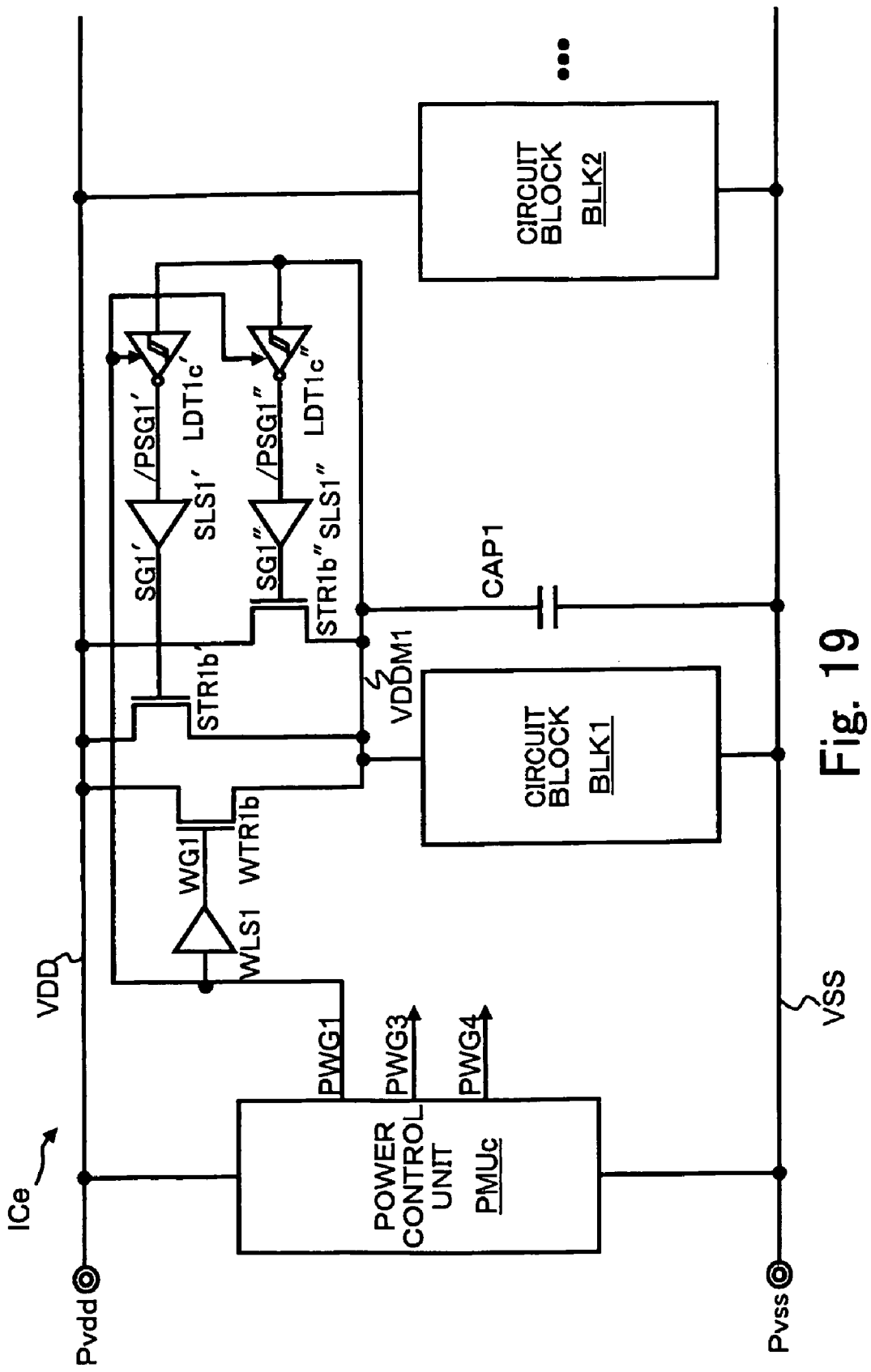
FIG. 19 is an explanatory diagram showing the sixth embodiment of the present invention.

FIG. 19 shows the sixth embodiment of the present invention. Incidentally, upon describing the sixth embodiment, the same numerals as those according to the first and fourth embodiments denote the same components as those according to the first and fourth embodiments, and the detailed explanation is omitted. A semiconductor device ICe according to the sixth embodiment is structured by replacing the power cutoff switch STRib (i=1, 3, 4), the level shifter SLSi, and the level detecting circuit LDTic in the semiconductor device ICc according to the fourth embodiment with a power cutoff switches STRib' and STRib", level shifters SLSi' and SLSi", and level detecting circuits LDTic' and LDTic". Incidentally, portions relevant to the circuit block BLK1 and BLK2 in the semiconductor device ICe are shown in FIG. 19.

Similarly to the power cutoff switch WTRib, the power cutoff switch STRib' is connected between the power line VDD and the power line VDDMi dedicated for the circuit block BLKi. The power cutoff switch STRib' comprises an nMOS transistor having a high threshold and, when the control signal SGi' is set at the high level, the power cutoff switch STRib' is ON. When the control signal SGi' is set at the low level, the power cutoff switch STRib' is OFF. Similarly to the power cutoff switch STRib', the power cutoff switch STRib" is connected between the power line VDD and the power line VDDMi. The power cutoff switch STRib" comprises an nMOS transistor having a high threshold and, when the control signal SGi" is set at the high level, the power cutoff switch STRib" is ON. When the control signal SGi" is set at the low level, the power cutoff switch STRib" is OFF. Incidentally, the sum of the current-supply capacity of the power cutoff switch STRib' and the current-supply capacity of the power cutoff switch STRib" corresponds to the current-supply capacity of the power cutoff switch STRib according to the fourth embodiment. Further, the current-supply capacity of the power cutoff switch STRib' is set to be smaller than the current-supply capacity of the power cutoff switch STRib".

When the control signal PWGi is set at the high level, if the voltage of the power line VDDMi is higher than the reference voltage, the level detecting circuit LDTic' sets the control signal /PSGi' at the low level. If the voltage of the power line VDDMi is lower than the reference voltage, the level detecting circuit LDTic' sets the control signal /PSGi' at the high level. When the control signal PWGi is set at the low level, the level detecting circuit LDTic' sets the control signal /PSGi' at the high level, irrespective of a level relationship between the voltage of the power line VDDMi and the reference voltage. Incidentally, the reference voltage of the level detecting circuit LDTic' is fixed to a prescribed voltage (e.g., a voltage equivalent to 50% of that of the power line VDD).

When the control signal PWGi is set at the high level, if the voltage of the power line VDDMi is higher than the reference voltage, the level detecting circuit LDTic" sets the control signal /PSGi" at the low level. If the voltage of the power line VDDMi is lower than the reference voltage, the level detecting circuit LDTic" sets the control signal /PSGi" at the high level. When the control signal PWGi is set at the low level, the level detecting circuit LDTic' sets the control signal /PSGi" at the high level, irrespective of a level relationship between the voltage of the power line VDDMi and the reference voltage. Incidentally, when the voltage of the power line VDDMi rises and matches the reference voltage, the level detecting circuit LDTic" changes the reference voltage from a first predetermined voltage (e.g., voltage equivalent to 90% of that of the power line VDD) to a second predetermined voltage (e.g., voltage equivalent to 50% of that of the power line VDD). If the control signal PWGi shifts from the high level to the low level, the level detecting circuit LDTic" changes the reference voltage to the first predetermined voltage from the second predetermined voltage.

The level shifter SLSi' embodies the level shift to the high level of an inversion signal of the control signal /PSGi', and generates the control signal SGi'. A voltage corresponding to the high level of the control signal SGi' is higher than the voltage of the power line VDD, and also a voltage corresponding to the low level of the control signal SGi' is that of the ground line VSS. The level shifter SLSi" embodies the level shift to the high level of an inversion signal of the control signal /PSGi", and generates the control signal SGi". A voltage corresponding to the high level of the control signal SGi" is higher than the voltage of the power line VDD, and a voltage corresponding to the low level of the control signal SGi" is that of the ground line VSS.

Figure 20:
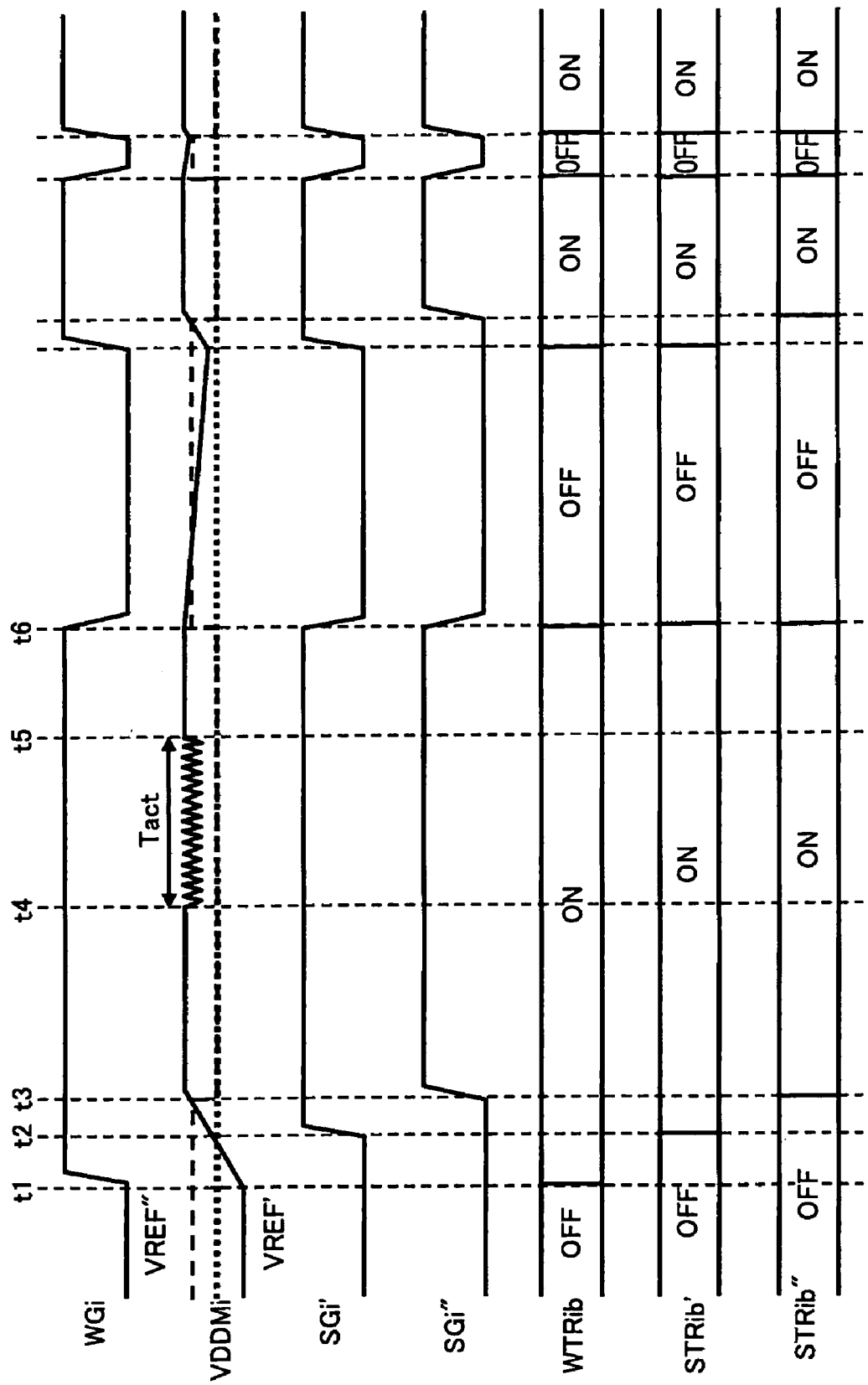
FIG. 20 is an explanatory diagram showing an operation example of a semiconductor device (non-defective product) according to the sixth embodiment.

FIG. 20 shows an operation example of the semiconductor device ICe (non-defective product) according to the sixth embodiment. In the operation example in FIG. 20, the power short-circuit does not exist in the semiconductor device ICe. At time t1, the control signal WGi shifts from the low level to the high level. Then, the power cutoff switch WTRib with a small current-supply capacity shifts from OFF to ON, and the voltage of the power line VDDMi starts to rise. At time t2, the voltage of the power line VDDMi rises and matches a reference voltage VREF' (voltage equivalent to 50% of that of the power line VDD) of the level detecting circuit LDTic'. Then, the control signal SGi' shifts from the low level to the high level, and the power cutoff switch STRib' with a small current-supply capacity shifts from OFF to ON. At time t3, the voltage of the power line VDDMi rises and matches a reference voltage VREF" (first predetermined voltage) of the level detecting circuit LDTic". Then, the control signal SGi" shifts from the low level to the high level, and the power cutoff switch STRib" with a large current-supply capacity shifts from OFF to ON. At the time, the reference voltage VREF" of the level detecting circuit LDTic" is changed from a first predetermined voltage (voltage equivalent to 90% of that of the power line VDD) to a second predetermined voltage (voltage equivalent to 50% of that of the power line VDD). Therefore, for an operation period Tact of the circuit block BLKi from time t4 to time t5, even if the noise occurs in the power line VDDMi by the operation of the circuit block BLKi, the voltage of the power line VDDMi is not lower than the reference voltage VREF" of the level detecting circuit LDTic". Accordingly, it is prevented that the control signal SGi" shifts from the high level to the low level by the noise of the power line VDDMi caused by the operation of the circuit block BLKi, and the power cutoff switch STRib" shifts from ON to OFF for the operation period Tact of the circuit block BLKi.

At time t1, the voltage of the power line VDDMi thereafter rises gradually by switching-on the power cutoff switch WTRib with a small current-supply capacity. At time t2, the level detecting circuit LDTic' detects the matching of the voltages and the power cutoff switch STRib' with a small current-supply capacity is then turned on. At time t3, the level detecting circuit LDTic" detects the matching of the voltages, and the power cutoff switch STRib" with a large current-supply capacity is then turned on. Thereby, the noise resulting from inrush current is suppressed. At time t6, the control signal WGi shifts from the high level to the low level and the power cutoff switch WTRib then shifts from ON to OFF. Further, when the control signal WGi shifts from the high level to the low level, the control signals SGi' and SGi" also shift from the high level to the low level. Thus, the power cutoff switches STRib' and STRib" also shift from ON to OFF, and the voltage of the power line VDDMi thereafter drops gradually by natural electric discharge. Further, the control signal WGi shifts from the high level to the low level, and the reference voltage VREF" of the level detecting circuit LDTic" is then changed to the first predetermined voltage from the second predetermined voltage. Thereby, the noise caused by the inrush current is suppressed without fail at the next ON-time of the power cutoff switches WTRib, STRib', and STRib".

Figure 21:
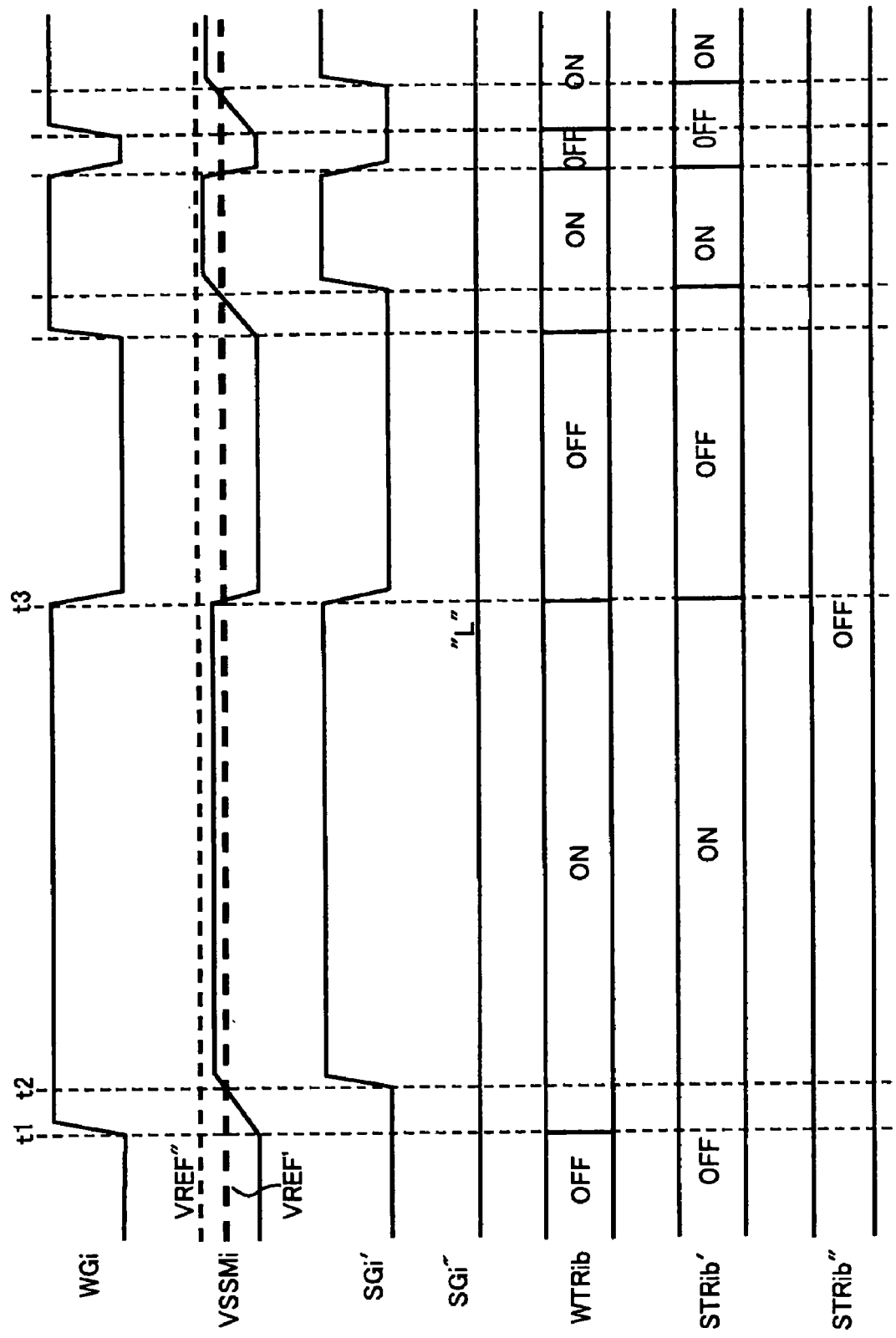
FIG. 21 is an explanatory diagram showing an operation example of a semiconductor device (defective product) according to sixth embodiment.

FIG. 21 shows an operation example of the semiconductor device ICe (defective product) according to the sixth embodiment. In the operation example shown in FIG. 21, the power short-circuit exists between the power line VDDMi and the ground line VSS in the semiconductor device ICe. At time t1, the control signal WGi shifts from the low level to the high level. Then, the power cutoff switch WTRib with a small current-supply capacity shifts from OFF to ON and the voltage of the power line VDDMi starts to rise. At time t2, the voltage of the power line VDDMi rises and matches a reference voltage VREF' of the level detecting circuit LDTic'. Then, the control signal SGi' shifts from the low level to the high level, and the power cutoff switch STRib' with a small current-supply capacity shifts from OFF to ON. Since the power short-circuit exists between the power line VDDMi and the ground line VSS in the semiconductor device ICe, the voltage of the power line VDDMi stops without increasing up to the reference voltage VREF" (first predetermined voltage) of the level detecting circuit LDTic", when drive current of the power cutoff switches WTRib and STRib' and current of the power short-circuit are saturated. Therefore, the control signal SGi" does not shift from the low level to the high level, and the power cutoff switch STRib" with a large current-supply capacity does not shift from OFF to ON. Accordingly, the external examination environment can be protected without fail. Since ON-current of the power cutoff switches WTRib and STRib' continues flowing, the defective product having the power short-circuit can be selected by measuring the current. At time t3, the control signal WGi shifts from the high level to the low level. Then, the power cutoff switch WTRi shifts from ON to OFF. Further, when the control signal WGi shifts from the high level to the low level, the control signal SGi' also shifts from the high level to the low level. Therefore, the power cutoff switch STRib' also shifts from ON to OFF. Thereafter, the voltage of the power line VDDMi drops steeply by the power short-circuit between the power line VDDMi and the ground line VSS.

The same advantages as those according to the fourth embodiment are obtained according to the sixth above embodiment. Furthermore, in place of the power cutoff switch STRib and the level detecting circuit LDTic according to the fourth embodiment, the power cutoff switches STRib' and STRib" and the level detecting circuits LDTic' and LDTic" are provided, thereby responding to the case of requiring a larger suppression of the noise resulting from the inrush current with a large-scaled circuit block BLKi (stabilization capacitor CAPi).

Figure 22:
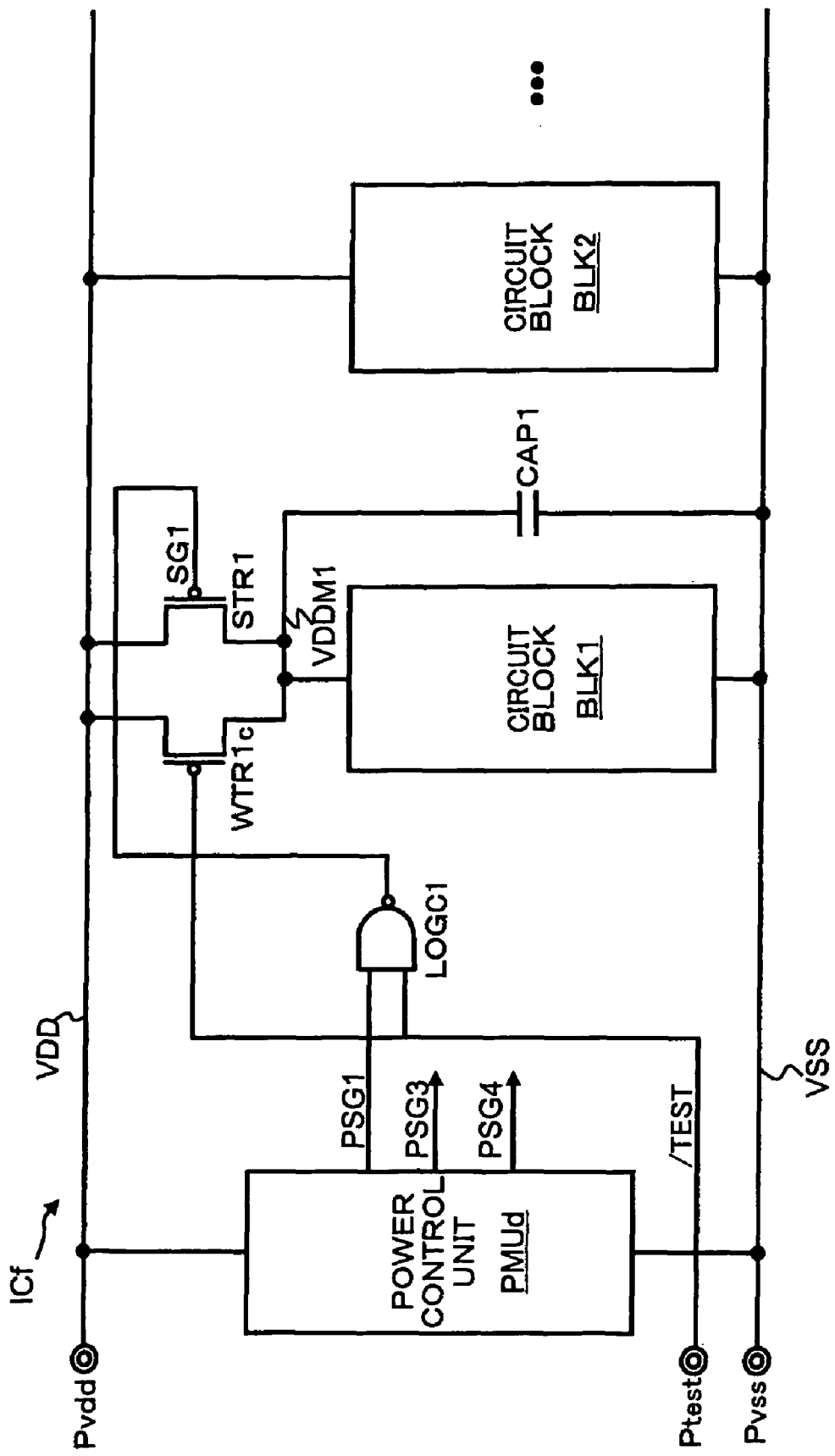
FIG. 22 is an explanatory diagram showing the seventh embodiment of the present invention.

FIG. 22 shows the seventh embodiment of the present invention. Incidentally, upon describing the seventh embodiment, the same numerals as those according to the first embodiment denote the same components as those according to the first embodiment, and the detailed explanation is omitted. A semiconductor device ICf comprises circuit blocks BLK1 to BLK5, similarly to the semiconductor device IC according to the first embodiment. Power cutoff functions are provided for the circuit blocks BLK1, BLK3, and BLK4 in the semiconductor device ICf, and power cutoff functions of the circuit blocks BLK1, BLK3, and BLK4 are controlled by a power control unit PMUd. The power control unit PMUd sets the control signal PSGi at the high level at the operation start of the circuit block BLKi (i=1, 3, 4), and further sets the control signal PSGi at the low level at the operation end of the circuit block BLKi. Incidentally, portions relevant to the circuit blocks BLK1 and BLK2 in the semiconductor device ICf are shown in FIG. 22.

The semiconductor device ICf comprises: a stabilization capacitor CAPi; power cutoff switches WTRic and STRi; and a logical circuit LOGCi, corresponding to the circuit block BLKi. The power cutoff switch WTRic is the same as the power cutoff switch WTRi according to the first embodiment, except for a point at which the power cutoff switch WTRic is turned on/off depending on a test signal /TEST supplied from a test terminal Ptest. Incidentally, the test signal /TEST is set at the high level in a normal operation mode of the semiconductor device ICf, and is set at the low level in a test mode of the semiconductor device ICf. When the test signal /TEST is set at a low level, the logical circuit LOGCi sets the control signal SGi at the high level. When the test signal /TEST is set at the high level, the logical circuit LOGCi sets the control signal SGi at the level opposite to that of the control signal PSGi.

In the semiconductor device ICf with the above structure, by setting the test signal /TEST at the low level via the test terminal Ptest, the power cutoff switch WTRic with a small current-supply capacity is forcedly ON. Further, the power cutoff switch STRi with a large current-supply capacity is forcedly OFF. Accordingly, even if the power short-circuit exists between the power line VDDMi and the ground line VSS in the semiconductor device ICf, the external examination environment can be protected without fail. When the power short-circuit exists between the power line VDDMi and the ground line VSS in the semiconductor device ICf, since ON-current of the power cutoff switch WTRic continues flowing, the defective product having the power short-circuit can be selected by measuring the current.

Figure 23:
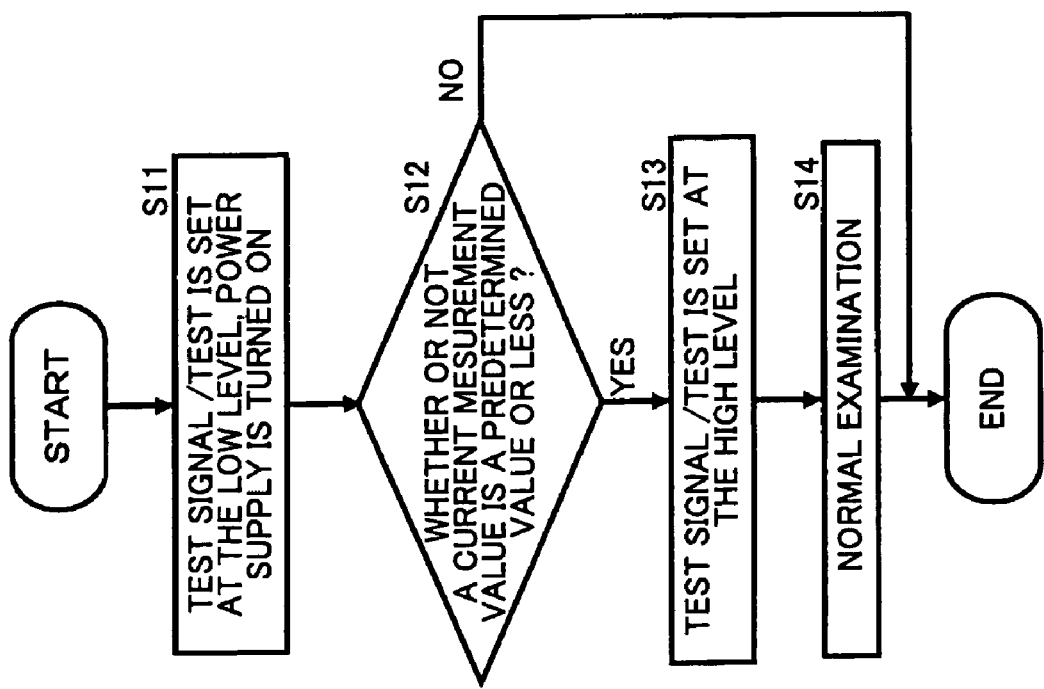
FIG. 23 is an explanatory diagram showing an examination flow of a semiconductor device according to the seventh embodiment.

FIG. 23 shows an examination flow of the semiconductor device ICf according to the seventh embodiment. In the examination of the semiconductor device ICf, first of all, the test signal /TEST is set at the low level via the test terminal Ptest, and the power supply is turned on (starting of the voltage of the power line VDD) (in step S11). Accordingly, the power cutoff switch WTRic with a small current-supply capacity is ON and the power cutoff switch STRi with a large current-supply capacity is OFF. Subsequently, it is determined whether or not a current measurement value is a predetermined value or less (in step S12). When the current measurement value is not the predetermined value or less, it is checked that the power short-circuit exists between the power line VDDMi and the ground line VSS in the semiconductor device ICf, and the semiconductor device ICf is selected as a defective product having the power short-circuit. On the other hand, when the current measurement value is the predetermined value or less, it is checked that the power short-circuit does not exist in the semiconductor device ICf, and the test signal /TEST is set at the high level via the test terminal Ptest On step S13). Accordingly, the power cutoff switch WTRic with a small current-supply capacity is OFF, and the ON/OFF operation of the power cutoff switch STRi with a large current-supply capacity can be controlled by the power control unit PMUd, and the normal examination (functional examination in the normal operation mode, etc.) is embodied (in step S14).

The same advantages as those according to the first embodiment are obtained according to the seventh embodiment. According to the first embodiment, the power cutoff switch STRi with a large current-supply capacity is ON after the level detecting circuit LDTi detects the matching of the voltages. However, according to the seventh embodiment, there is an advantage that the power cutoff switch STRi with a large current-supply capacity in the normal operation mode is immediately ON in response to a request from the power control unit PMUd.

Although the power cutoff switch comprising the pMOS transistor is disposed on the power line VDD side of the circuit block BLKi according to the seventh embodiment, the present invention is not limited to this embodiment. A power cutoff switch comprising an nMOS transistor may be disposed on the power line VDD side of the circuit block BLKi. Alternatively, a power cutoff switch comprising a pMOS transistor may be disposed on the ground line VSS side of the circuit block BLKi. Alternatively, a power cutoff switch comprising an nMOS transistor may be disposed on the ground line VSS side of the circuit block BLKi.

Figure 24:
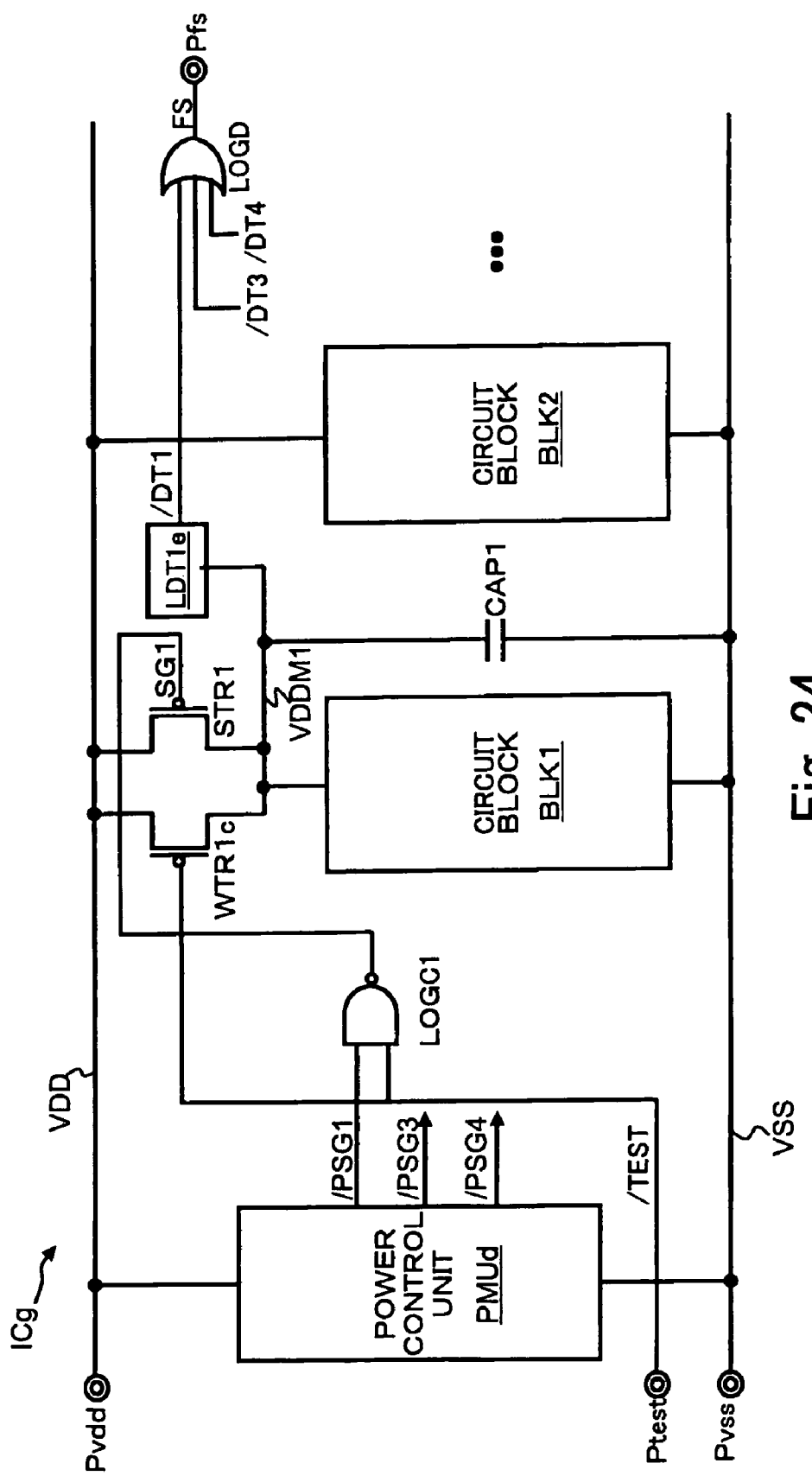
FIG. 24 is an explanatory diagram showing the eighth embodiment of the present invention.

FIG. 24 shows the eighth embodiment of the present invention. Incidentally, upon describing the eighth embodiment, the same numerals as those according to the first and seventh embodiments denote the same components as those according to the first and seventh embodiments, and the detailed explanation is omitted. A semiconductor device ICg according to the eighth embodiment is structured by adding a level detecting circuit LDTie (i=1, 3, 4) and a logical circuit LOGD to the semiconductor device ICf according to the seventh embodiment. Incidentally, portions relevant to the circuit blocks BLK1 and BLK2 in the semiconductor device ICf are shown in FIG. 22.

When the voltage of the power line VDDMi rises and matches a reference voltage (e.g., voltage equivalent to 90% of that of the power line VDD), the level detecting circuit LDTie shifts a detection result signal /DTR from the high level to the low level. When all of detection result signals /DT1, /DT3, and /DT4 supplied from level detecting circuits LDT1e, LDT3e, and LDT4e are set at the low level, the logical circuit LOGD sets a fail signal FS at the low level. When at least one of the detection result signals /DT1, /DT3, and the DT4 is set at the high level, the logical circuit LOGD sets the fail signal FS at the high level. The fail signal FS is externally outputted to the semiconductor device ICg via a test terminal Pfs. In the semiconductor device ICg with the above structure, when the power short-circuit exists between the power line VDDMi and the ground line VSS in the semiconductor device ICg, the fail signal FS outputted from the test terminal Pfs is set at the high level. Therefore, the defective product having the power short-circuit can be selected by checking the level of the fail signal FS.

Figure 25:
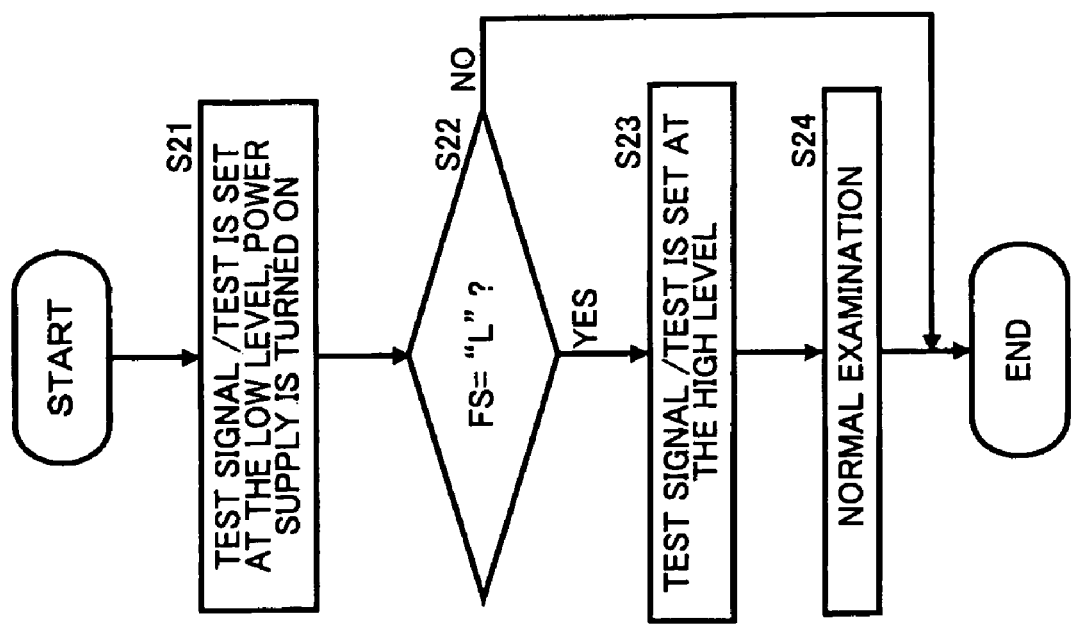
FIG. 25 is an explanatory diagram showing an examination flow of a semiconductor device according to the eighth embodiment.
Figures 26A, 26B:
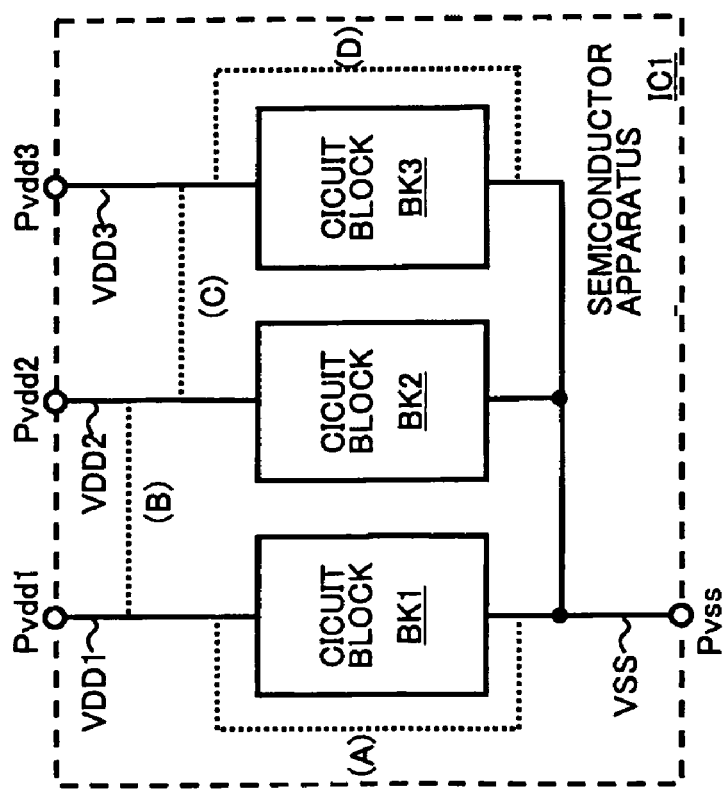
FIGS. 26A and 26B are explanatory diagrams showing a power short-circuit examination of a semiconductor device.
Figures 27A, 27B:
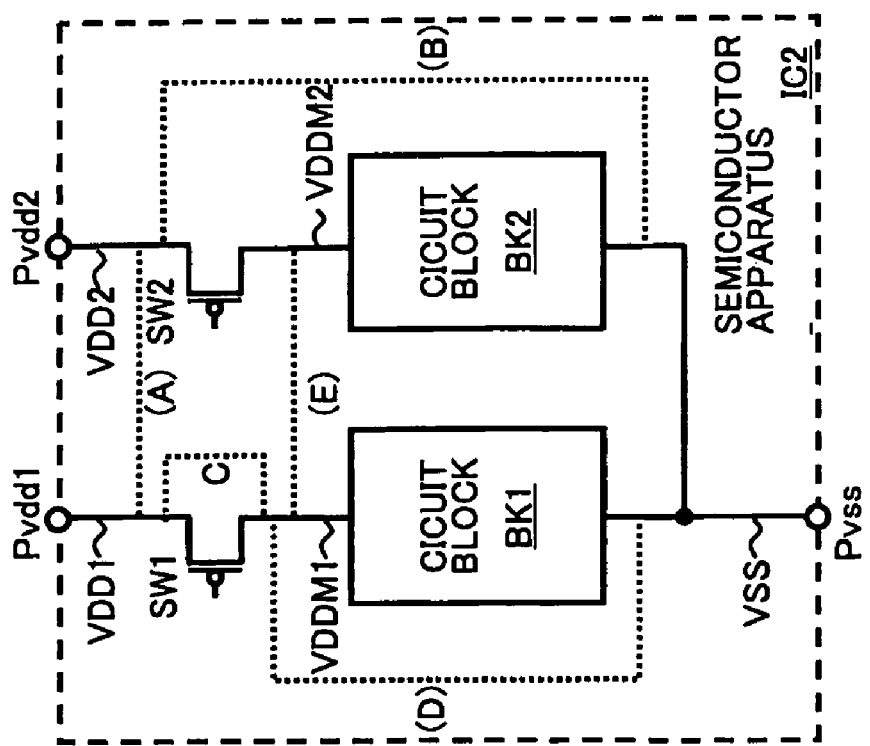
FIGS. 27A and 27B are explanatory diagrams showing a problem upon installing a power cutoff function to a semiconductor device.

FIG. 25 shows an examination flow of the semiconductor device ICg according to the eighth embodiment. In the examination of the semiconductor device ICg, first of all, the test signal /TEST is set at the low level via the test terminal Ptest, and the power supply is turned on (starting of the voltage of the power line VDD) is embodied (in step S21). If the power cutoff switch WTRic with a small current-supply capacity is ON, the power cutoff switch STRi with a large current-supply capacity is OFF. Subsequently, it is determined whether or not the fail signal FS outputted from the test terminal Pfs is set at the low level (in step S22). When the fail signal FS is set at the high level, it is checked that the power short-circuit exists between the power line VDDMi and the ground line VSS in the semiconductor device ICg, and the semiconductor device ICg is selected as the defective product having the power short-circuit. On the other hand, when the fail signal FS is set at the low level, it is checked that the power short-circuit does not exist in the semiconductor device ICg, and the test signal /TEST is set at the high level via the test terminal Ptest (in step S23). Accordingly, the power cutoff switch WTRic with a small current-supply capacity is OFF, and ON/OFF operation of the power cutoff switch STRi with a large current-supply capacity can be controlled by the power control unit PMUd. Then, the normal examination (functional examination in the normal operation mode, etc.) is embodied (in step S24).

The same advantages as those according to the seventh embodiment are obtained according to the eighth embodiment. It can be determined whether or not the semiconductor device ICg is a defective product having the power short-circuit only by checking the level of the fail signal FS outputted from the test terminal Pfs. Therefore, this can contribute to the simplification of the examination of the power short-circuit.

As stated above, the semiconductor device in the first example of the present invention comprises the circuit block, the first power cutoff switch, the second power cutoff switch, and the detecting circuit. The first power cutoff switch is disposed between the power line and the internal power line dedicated for the circuit block, and has the current-supply capacity having the level that ON-current can protect the external examination environment. The second power cutoff switch is disposed between the power line and the internal power line, and has the current-supply capacity having the level that ON-current can supply the consumed electric current of the circuit block. The detecting circuit detects that the voltage of the internal power line matches the reference voltage. The first power cutoff switch is ON/OFF depending on the operation state of the circuit block. The second power cutoff switch is ON by the result of the matching of the voltages by the detecting circuit, and is OFF by the OFF-operation of the first power cutoff switch.

In the semiconductor device with the above structure, it is assumed that the power line is a high-potential one. Then, the voltage of the internal power line starts to rise by turning on the first power cutoff switch with a small current-supply capacity. When the power short-circuit does not exist between the internal power line and a low-potential power line, the detecting circuit detects that the voltage of the internal power line matches the reference voltage, and the second power cutoff switch with a large current-supply capacity is ON. On the other hand, when the power short-circuit exists between the internal power line and a low-potential power line, the detecting circuit does not detect that the voltage of the internal power line matches the reference voltage, and the second power cutoff switch with a large current-supply capacity is not ON. Therefore, the external examination environment can be protected without fail. Further, since ON-current of the first power cutoff switch continues flowing, the defective product having the power short-circuit can be selected by measuring the current. That is, the examination of the power short-circuit can be implemented without providing the pad for examination. Since the pad for examination is unnecessary, the chip size of the semiconductor device can be reduced, thereby resulting in the contribution to the reduction in manufacturing costs of the semiconductor device.

As the second example of the present invention, the semiconductor device comprises the circuit block, the first power cutoff switch, and the second power cutoff switch. The first power cutoff switch is disposed between the power line and the internal power line dedicated for the circuit block, and has the current-supply capacity having the level that ON-current can protect the external examination environment. The second power cutoff switch is disposed between the power line and the internal power line, and has the current-supply capacity having the level that ON-current can supply the consumed current of the circuit block. The first power cutoff switch is OFF in the normal operation mode, and is ON in the test mode. The second power cutoff switch is ON/OFF depending on the operation state of the circuit block in the normal operation mode, and is OFF in the test mode.

With the semiconductor device having the above structure, the semiconductor device shifts to the test mode, the first power cutoff switch with a small current-supply capacity is forcedly ON, and the second power cutoff switch with a large current-supply capacity is forcedly OFF. Accordingly, it is assumed that the power line is a high-potential one. Then, even if the power short-circuit exists between the internal power line and a low-potential power line, the external examination environment can be protected without fail. Further, when the power short-circuit exists between the internal power line and the low-potential power line, ON-current of the first power cutoff switch continues flowing. Therefore, the defective product having the power short-circuit can be selected by measuring the current. That is, the examination of the power short-circuit can be implemented, without providing the pad for examination. Since the pad for examination is unnecessary, the chip size of the semiconductor device can be small, thereby resulting in the contribution to the reduction in manufacturing costs of the semiconductor device.

As the third example of the present invention, the semiconductor device comprises the circuit block, the power cutoff switch, the stabilization capacitor, and the discharge switch. The power cutoff switch is disposed between the power line and the internal power line dedicated for the circuit block, and is ON/OFF depending on the operation state of the circuit block. The stabilization capacitor is connected to the internal power line. In the test mode, the discharge switch is ON by switching off the power cutoff switch, thereby discharging the charges stored in the stabilization capacitor.

With the semiconductor device having the above structure, the charges stored in the stabilization capacitor connected to the internal power line are discharged by switching-on the discharge switch by the OFF-operation of the power cutoff switch. Accordingly, it is assumed that the power line is a high-potential one. Then, when the power short-circuit exists between the internal power line and the power line, the ON-current of the discharge switch continues flowing, thereby selecting the defective product having the power short-circuit by measuring the current. That is, the examination of the power short-circuit can be implemented without providing the pad for examination. Since the pad for examination is unnecessary, the chip size of the semiconductor device can be small, thereby resulting in the contribution to the reduction in manufacturing costs of the semiconductor device.

As mentioned above, although the present invention has been explained in details, the above-mentioned embodiments and those modification are only examples of the present invention, and the present invention is not limited to these. Obviously, the present invention can be modified without departing the range of the present invention.

What is claimed is:

1. A semiconductor device comprising:
   a first power line and a second power line;
   a circuit block connected to the second power line to receive a power supply voltage;
   a first switch connected between the first power line and the second power line; and
   a second switch connected between the first power line and the second power line,
   wherein the first switch is off in a normal operation mode and is on in a test mode, and
   the second switch is off in the test mode, and
   an operation state of the circuit block is on or off in the normal operation mode by on or off operation of the second switch.

2. The semiconductor device according to claim 1, wherein the first switch has a current supply capacity having the level that on current of the first switch protects an external examination environment, and
   the second switch has a current supply capacity having the level that on current of the second switch supplies the consumed current of the circuit block.

3. The semiconductor device according to claim 1, further comprising:
   an external input terminal coupled to the first switch and the second switch that inputs an external test signal for instructing a shift to the test mode of the semiconductor device.

4. The semiconductor device according to claim 3, wherein in an examination process, the semiconductor device shifts to the test mode ahead of the normal operation mode by the external test signal, and further shifts to the normal operation mode after an examination of a power short circuit.

5. The semiconductor device according to claim 1, further comprising:
   a detecting circuit that detects the voltage difference between a voltage of the second power line and a reference voltage; and
   an external output terminal that externally outputs a detection result signal indicating the voltage difference detected by the detecting circuit.

6. The semiconductor device according to claim 1, wherein the first and second switches comprise pMOS transistors.

7. A semiconductor device comprises:
   a first power line and a second power line;
   a circuit block connected to the second power line to receive a power supply voltage;
   a first switch connected between the first power line and the second power line, the first switch being capable of tuning on or off in dependence on a state of operation of the circuit block;
   a capacitor connected to the second power line; and
   a second switch being on by an off operation of the first switch and discharging charges stored in the capacitor in a test mode.

8. The semiconductor device according to claim 7, wherein the capacitor is a stabilization capacitor for holding the power supply voltage supplied to the circuit block.

9. The semiconductor device according to claim 7, wherein the second switch comprises a pMOS transistor.

10. A semiconductor device comprising:
    a first power line and a second power line;
    a circuit block connected to the second power line to receive a power supply voltage;
    a first switch connected between the first power line and the second power line; and
    a second switch connected between the first power line and the second power line; wherein
    the first switch is on in a test mode;
    the second switch is off in the test mode; and
    an operation state of the circuit block is on or off in a normal operation mode by an on or off operation of the second switch.

11. The semiconductor device according to claim 10, wherein the first switch is off in the normal operation mode.

* * * * *